(12) United States Patent
Hsu et al.

(10) Patent No.: US 10,497,574 B2
(45) Date of Patent: Dec. 3, 2019

(54) METHOD FOR FORMING MULTI-LAYER MASK

(71) Applicant: TAIWAN SEMICONDUCTOR MANUFACTURING CO., LTD., Hsinchu (TW)

(72) Inventors: Chung-Wei Hsu, Hsinchu County (TW); Yu-Chung Su, Hsinchu (TW); Chen-Hao Wu, Keelung (TW); Shen-Nan Lee, Hsinchu County (TW); Tsung-Ling Tsai, Hsinchu (TW); Teng-Chun Tsai, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/138,632

(22) Filed: Sep. 21, 2018

(65) Prior Publication Data

US 2019/0096686 A1    Mar. 28, 2019

Related U.S. Application Data

(60) Provisional application No. 62/564,917, filed on Sep. 28, 2017.

(51) Int. Cl.
| | | |
|---|---|---|
| *B24B 37/04* | (2012.01) | |
| *B24B 57/02* | (2006.01) | |
| *H01L 21/321* | (2006.01) | |
| *H01L 21/308* | (2006.01) | |
| *H01L 21/306* | (2006.01) | |
| *H01L 29/66* | (2006.01) | |
| *H01L 29/78* | (2006.01) | |

(52) U.S. Cl.
CPC ...... *H01L 21/3086* (2013.01); *H01L 21/3081* (2013.01); *H01L 21/30608* (2013.01); *H01L 29/66545* (2013.01); *H01L 29/78* (2013.01)

(58) Field of Classification Search
None
See application file for complete search history.

(56) References Cited

PUBLICATIONS

Marc Weimer et al., "Materials for and performance of multilayer lithography schemes", Society of Photo-Optical Instrumentation Engineers, vol. 6519 (2007).

*Primary Examiner* — Allan W. Olsen
(74) *Attorney, Agent, or Firm* — Maschoff Brennan

(57) ABSTRACT

A method includes forming a spin-on carbon (SOC) layer over a target structure; chemically treating an upper portion of the SOC layer; forming a sacrificial layer over the SOC layer; performing a chemical mechanical polish (CMP) process on the sacrificial layer until reaching the SOC layer, wherein the chemically treated upper portion of the SOC layer has a higher resistance to the CMP process than that of the sacrificial layer; forming a patterned photoresist layer over the SOC layer after the CMP process; and etching the target structure using the patterned photoresist layer as a mask.

20 Claims, 31 Drawing Sheets

METHOD FOR FORMING MULTI-LAYER MASK

PRIORITY CLAIM AND CROSS-REFERENCE

This application claims priority to U.S. Provisional Application Ser. No. 62/564,917, filed Sep. 28, 2017, which is herein incorporated by reference in its entirety.

BACKGROUND

The manufacturing of integrated circuits includes multiple photolithography processes. When the dimensions of the integrated circuits become increasingly smaller, the requirement for controlling the critical dimensions of the integrated circuits is also increasingly tightened. The critical dimensions are the minimum width of gate electrodes of the transistors in the wafer. The critical dimensions may be used as a reference for forming metal layers.

In processes for controlling the critical dimensions, a tri-layer mask is formed on a wafer. The tri-layer mask includes a bottom layer, a middle layer over the bottom layer, and a photoresist over the middle layer. The photoresist is exposed using a photolithography mask, which includes opaque patterns and transparent patterns. The photoresist is then patterned through development. The patterned photoresist is used as an etching mask of the middle layer. The patterned middle layer is then used as an etching mask to etch the bottom layer. The patterned bottom layer is used as an etching mask to etch an underlying layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
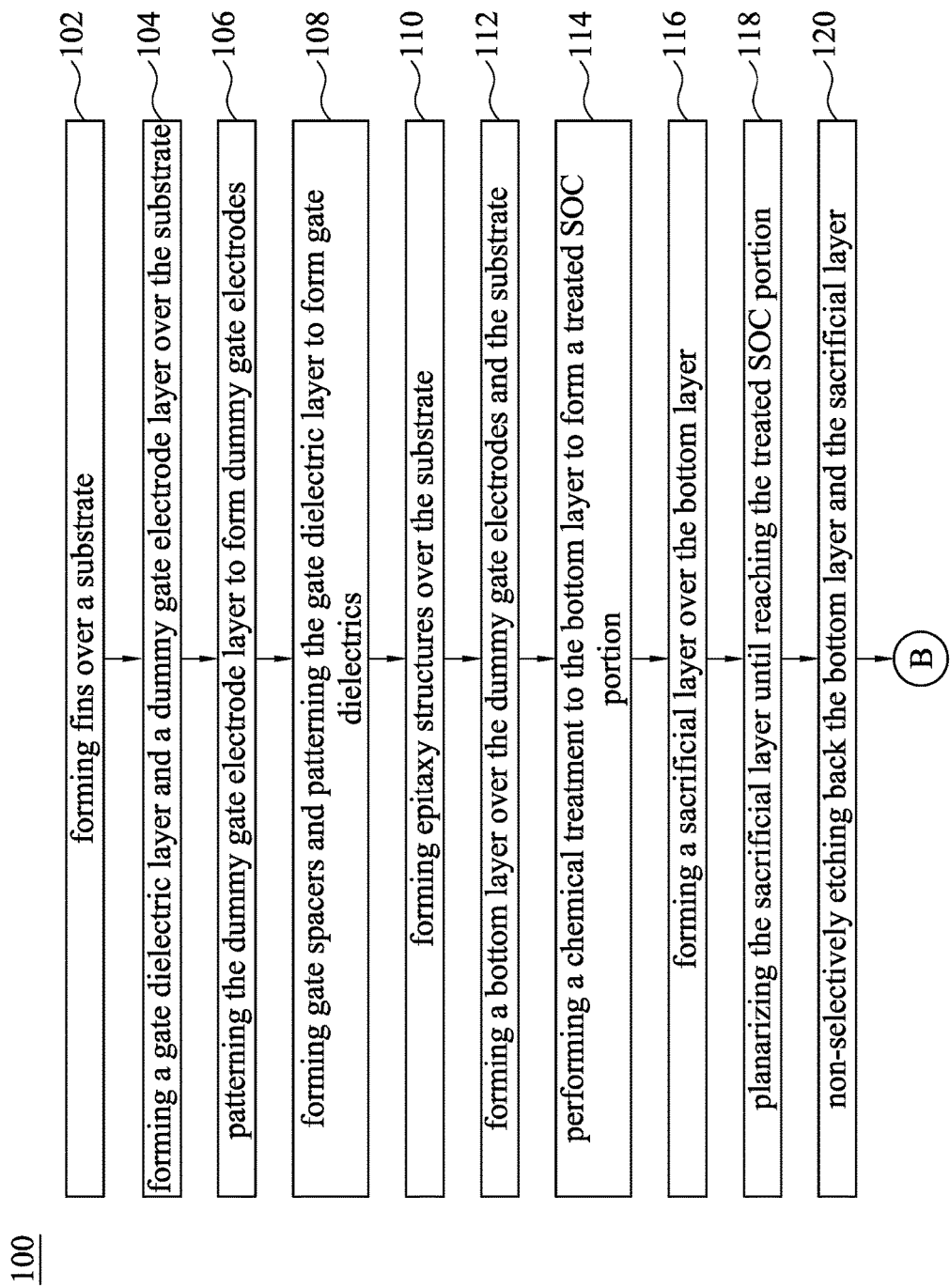
FIGS. 1A and 1B are flow charts showing a method for forming a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a multi-layer mask for a semiconductor structure and a method of forming the same. In particular, a method of planarizing a bottom layer of a multi-layer mask is described herein. The embodiments described herein are not limited to planarizing a bottom layer of a multi-layer mask and may be also used to planarize other layers of a semiconductor structure.

Figure 1B:
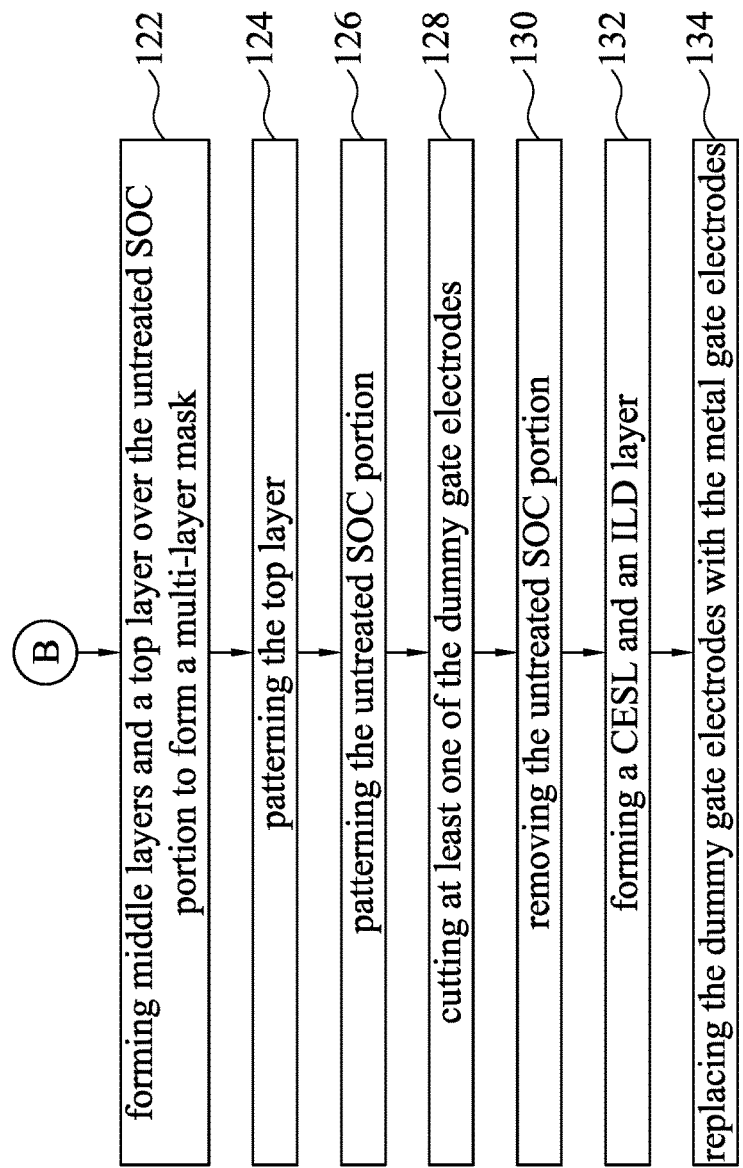
Figure 2A:
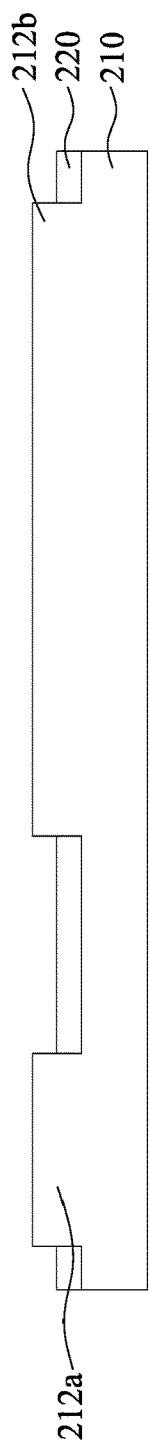
FIGS. 2A-2U illustrate various processing steps during forming a semiconductor device in accordance with some embodiments.
Figure 2B:
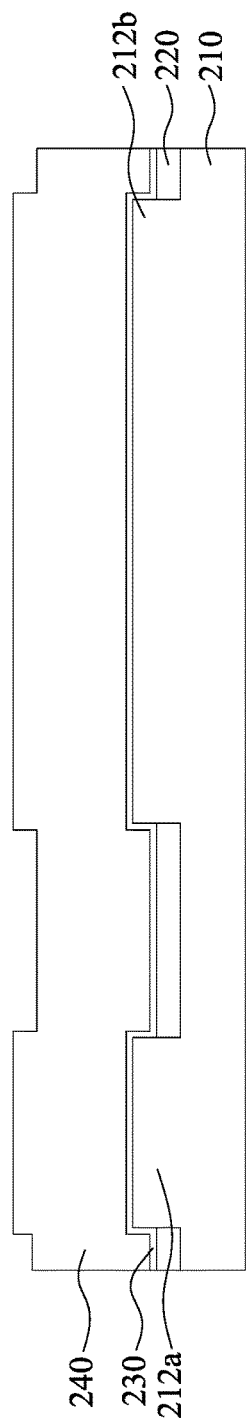
Figure 2C:
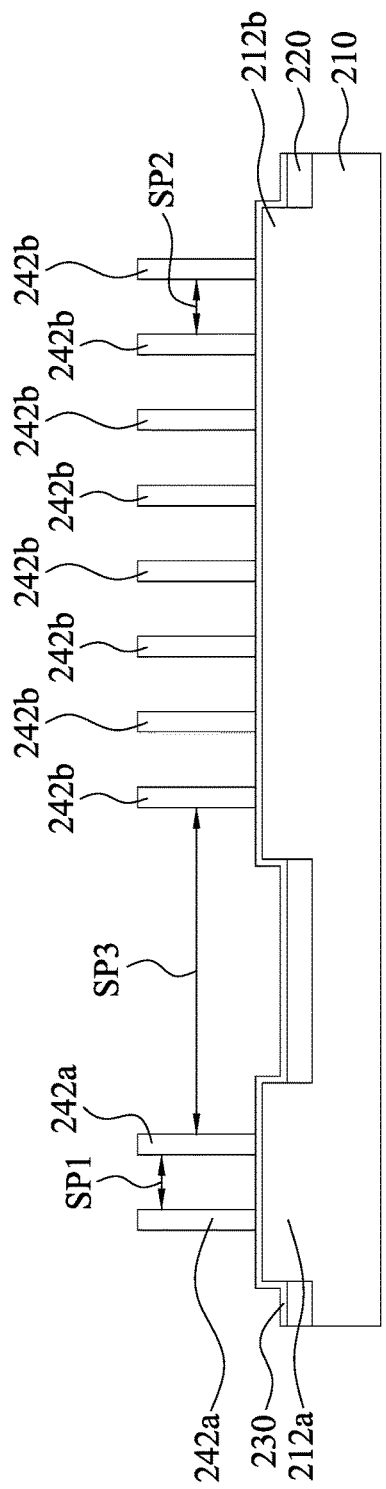
Figure 2D:
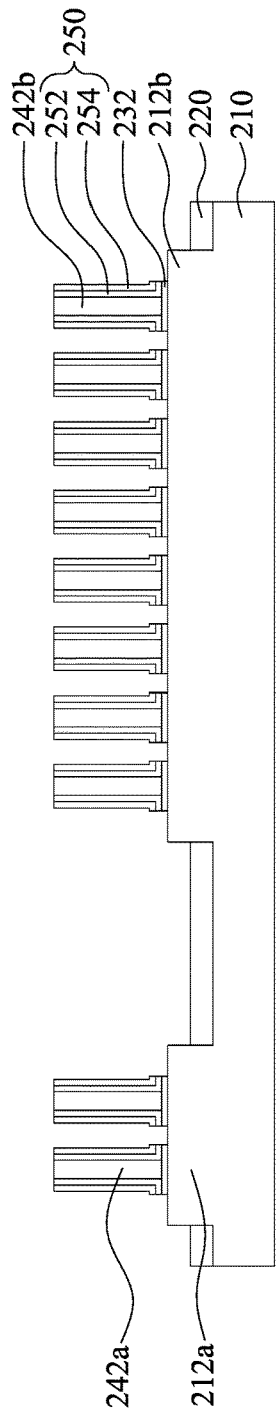
Figure 2E:
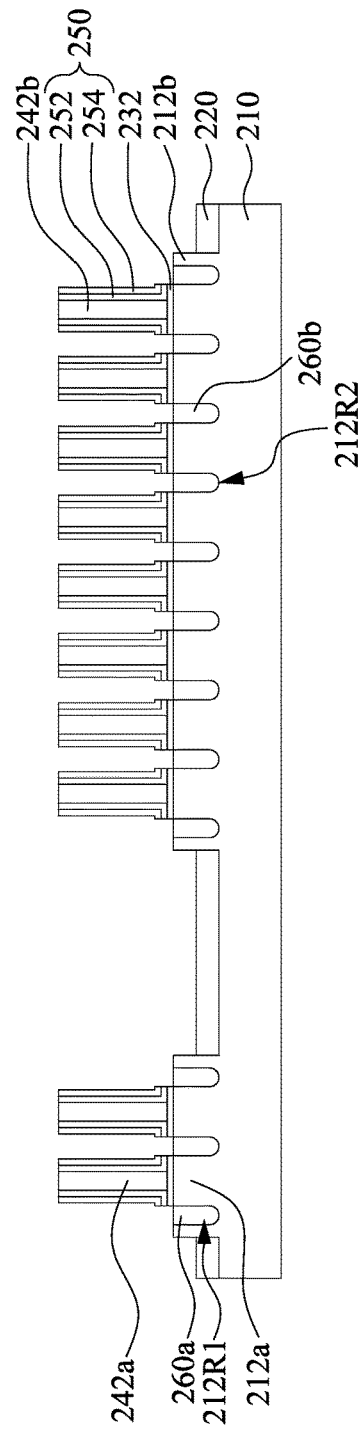
Figure 2F:
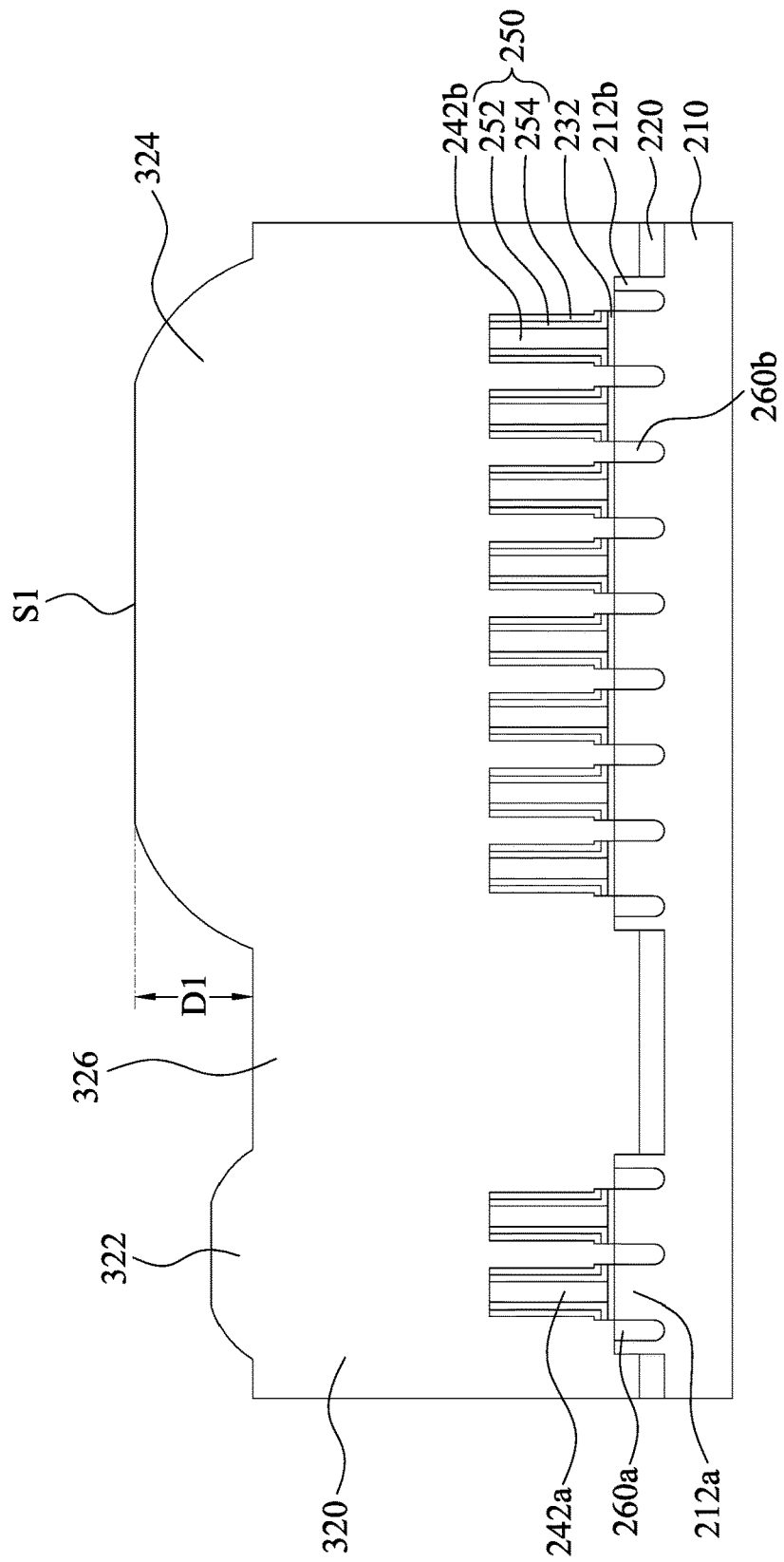
Figure 2G:
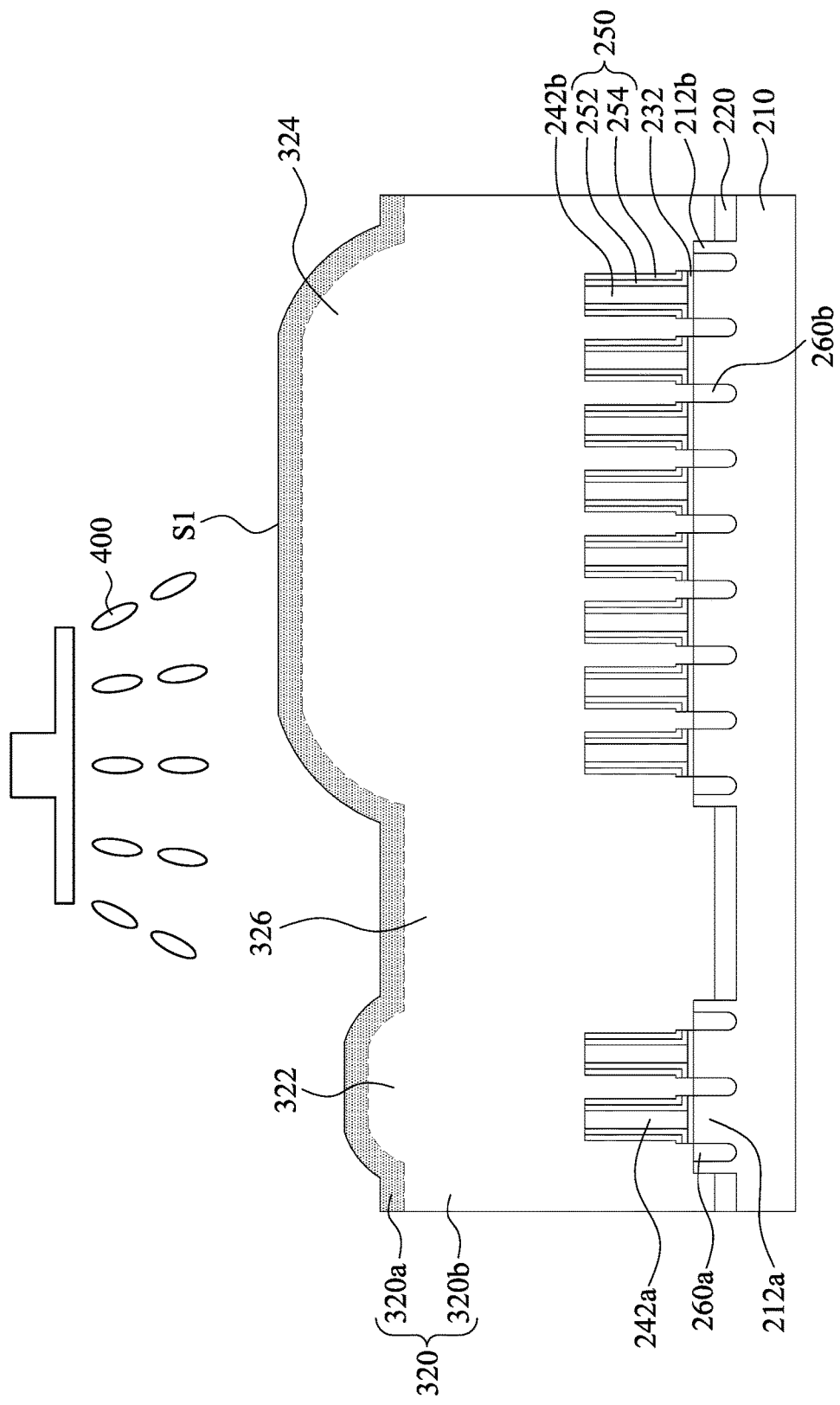
Figure 2H:
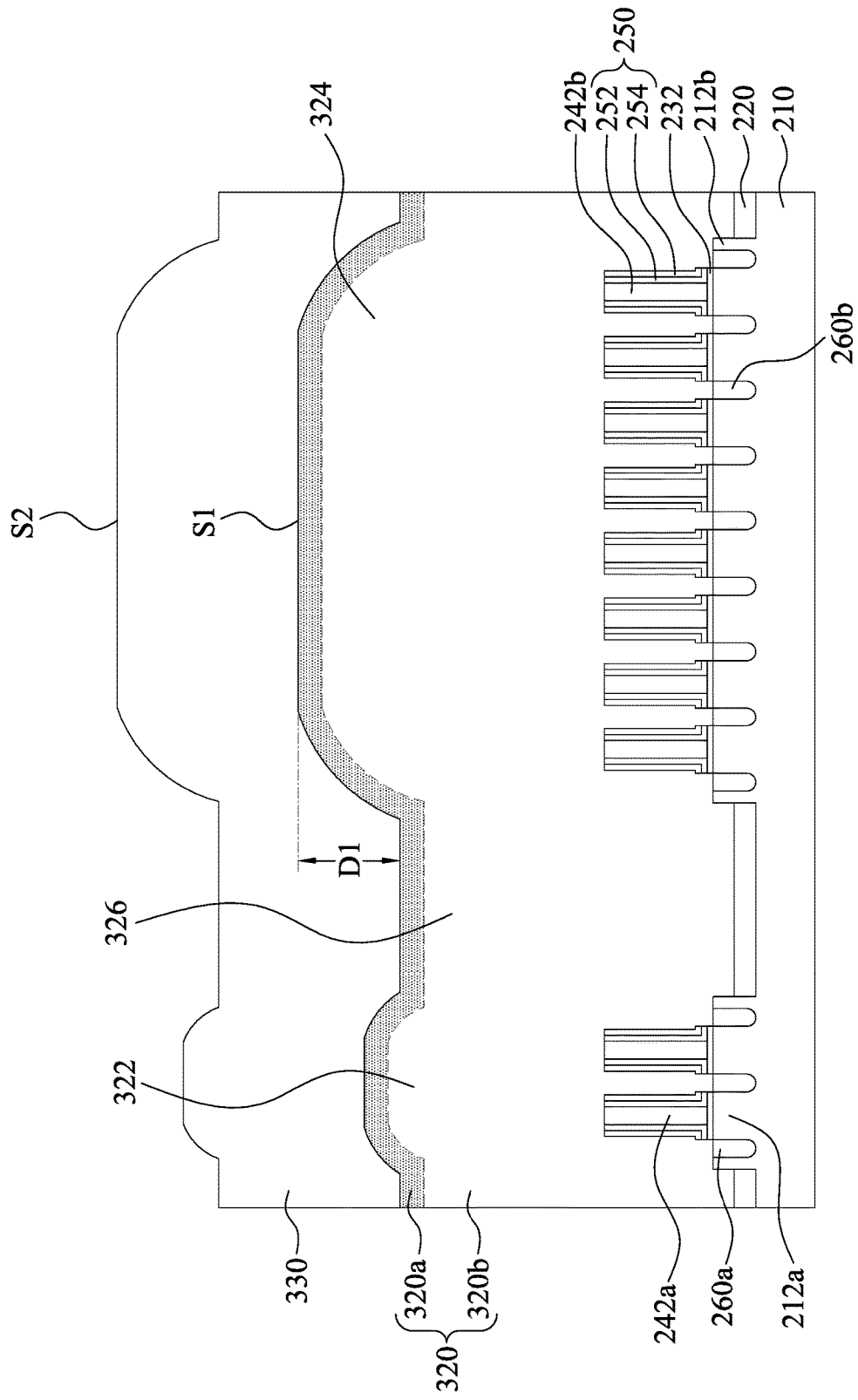
Figure 2I:
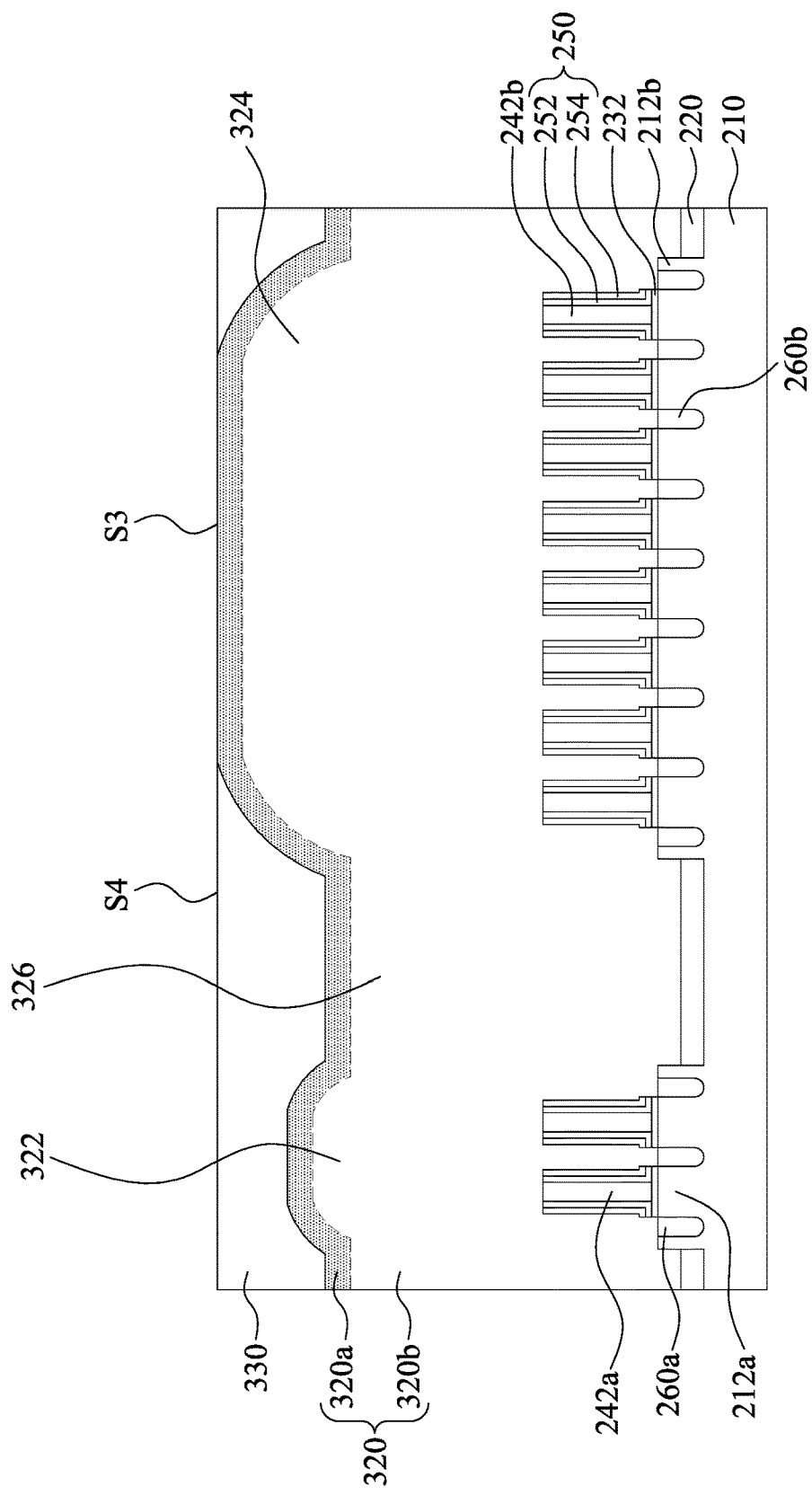
Figure 2J:
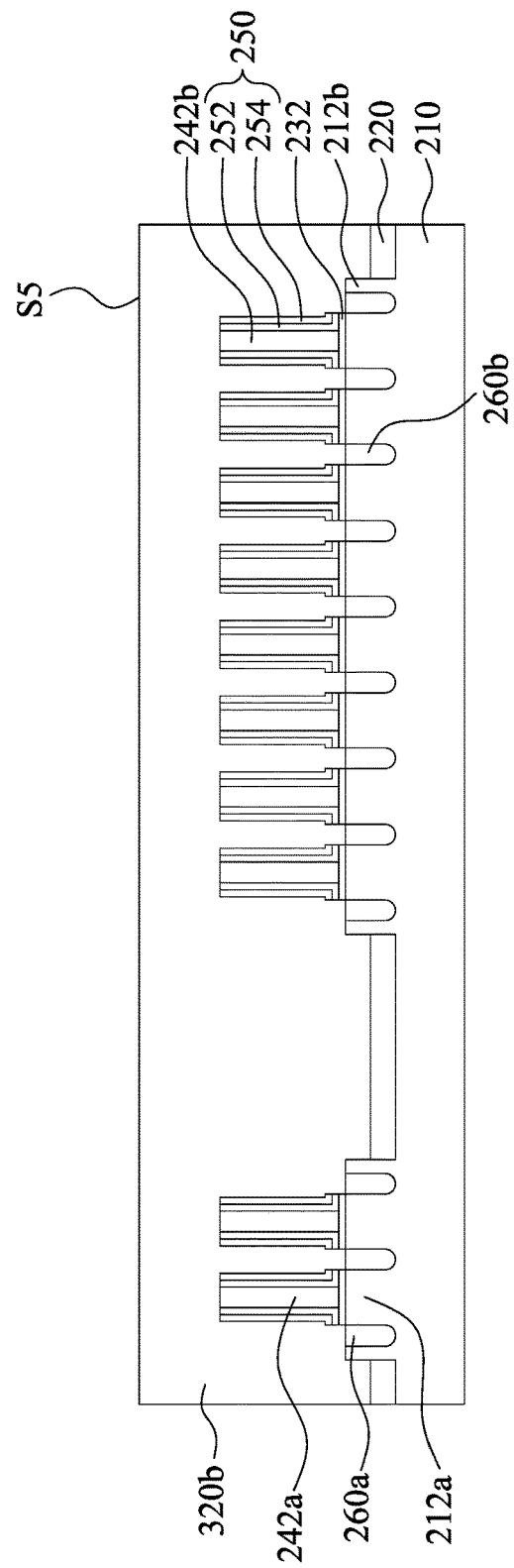
Figure 2K:
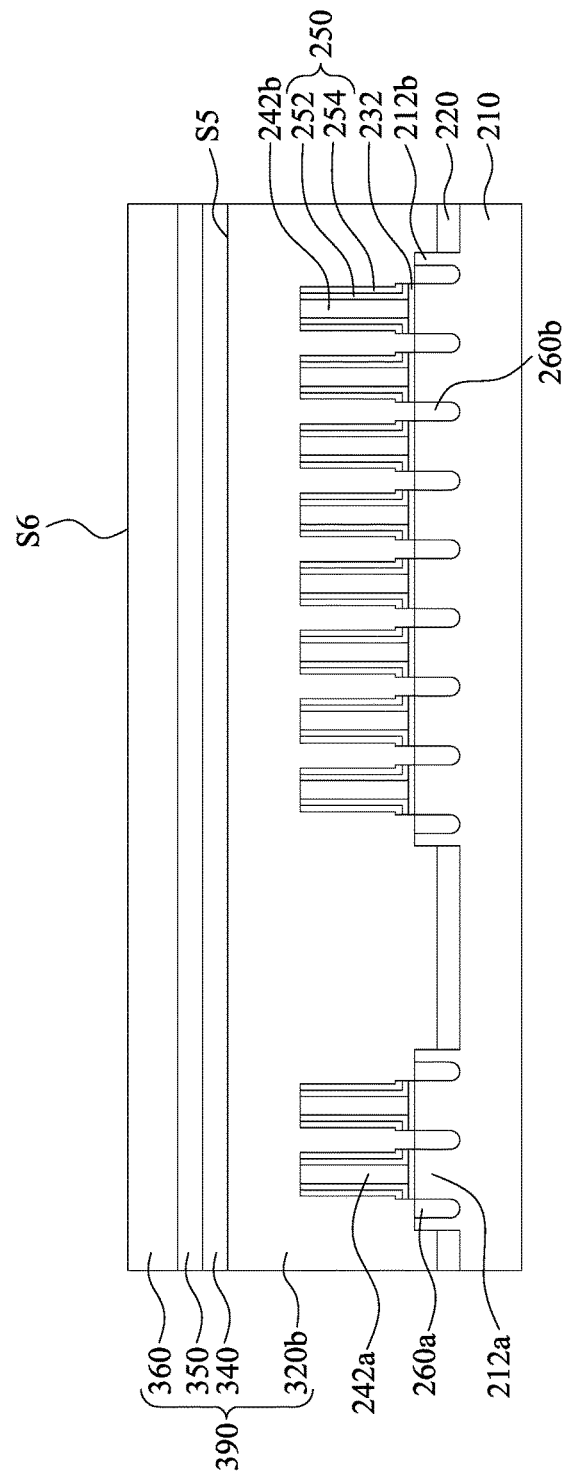
Figure 2L:
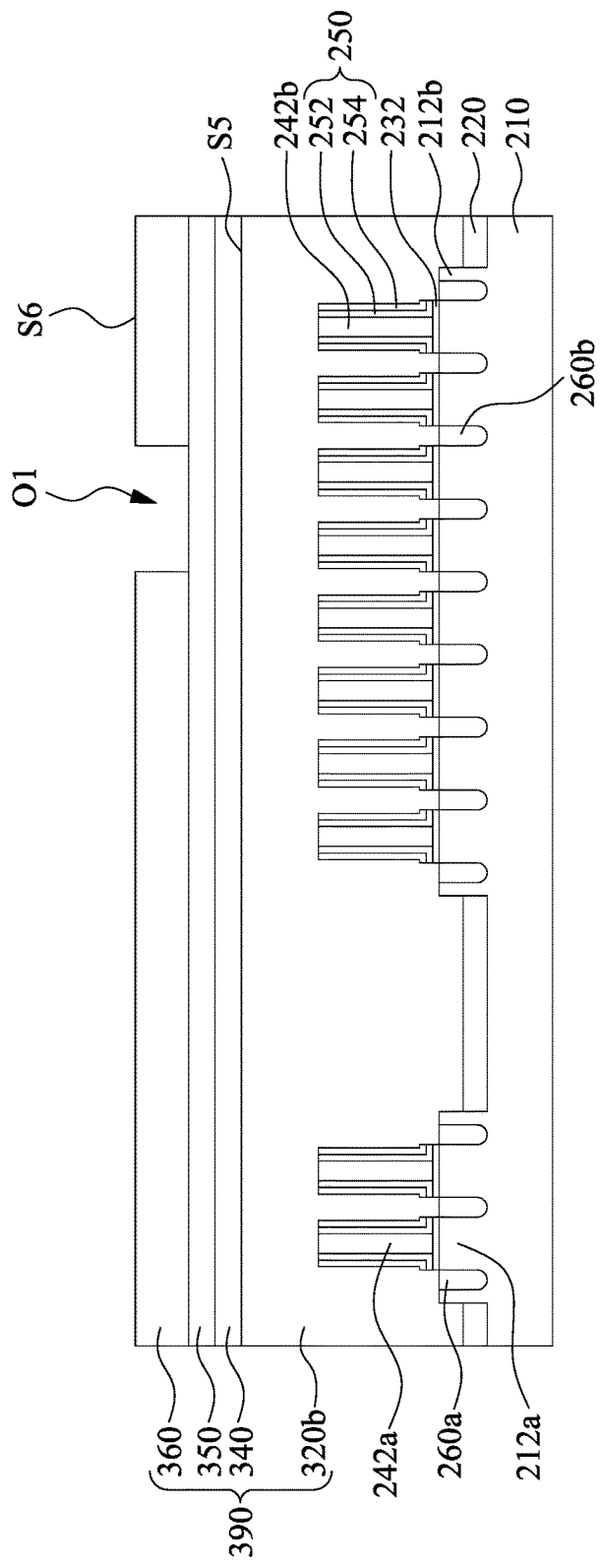
Figure 2M:
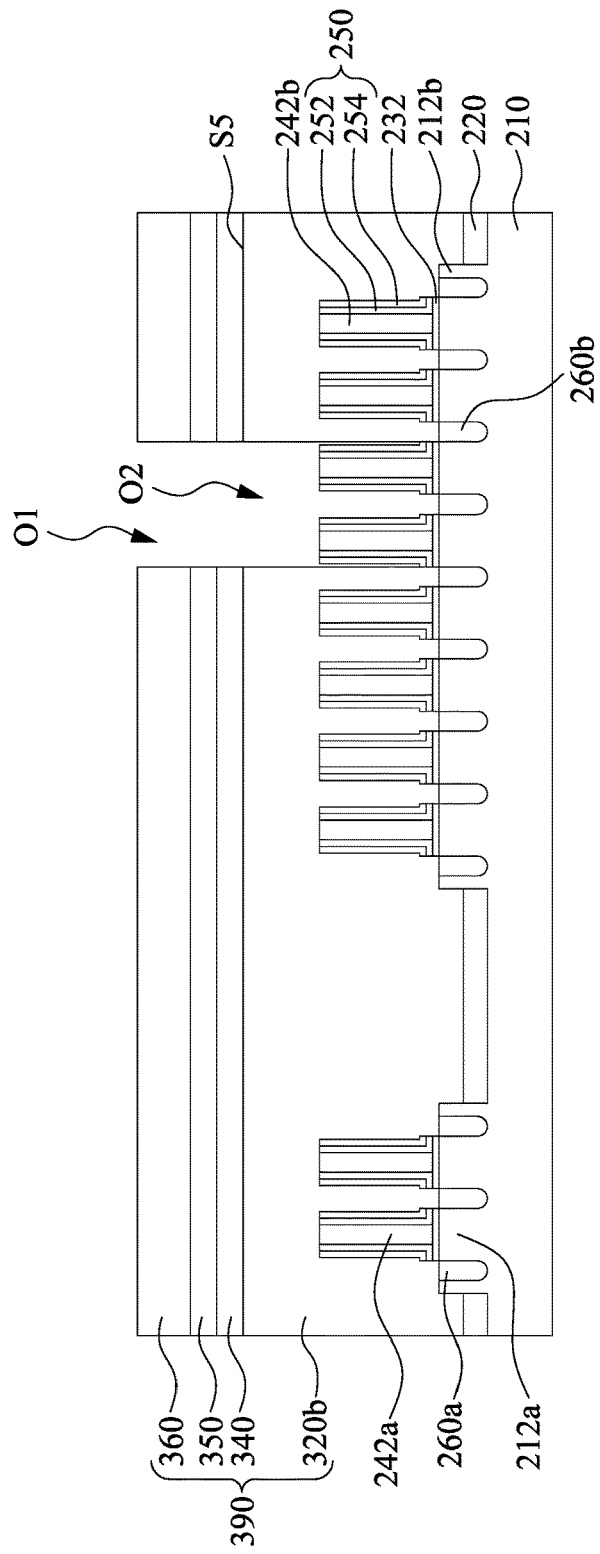
Figure 2N:
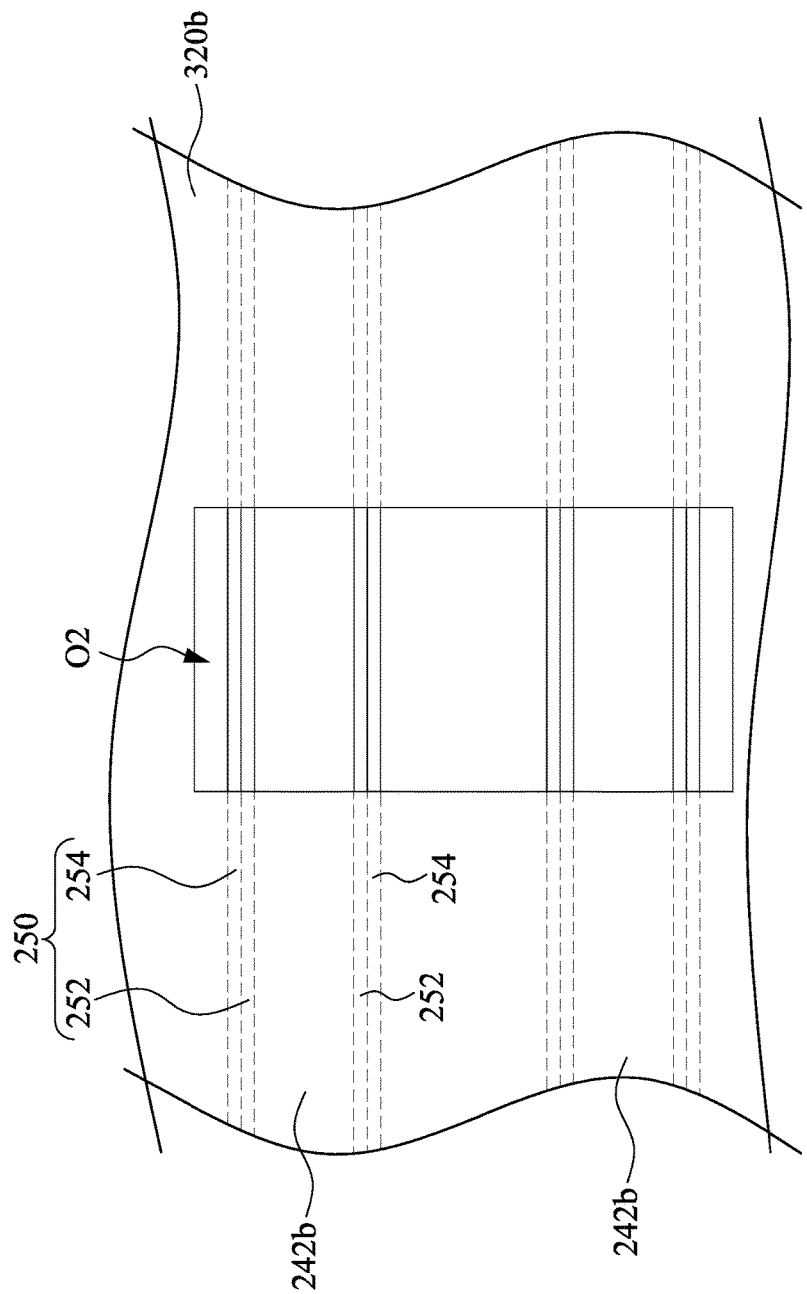
Figure 2O:
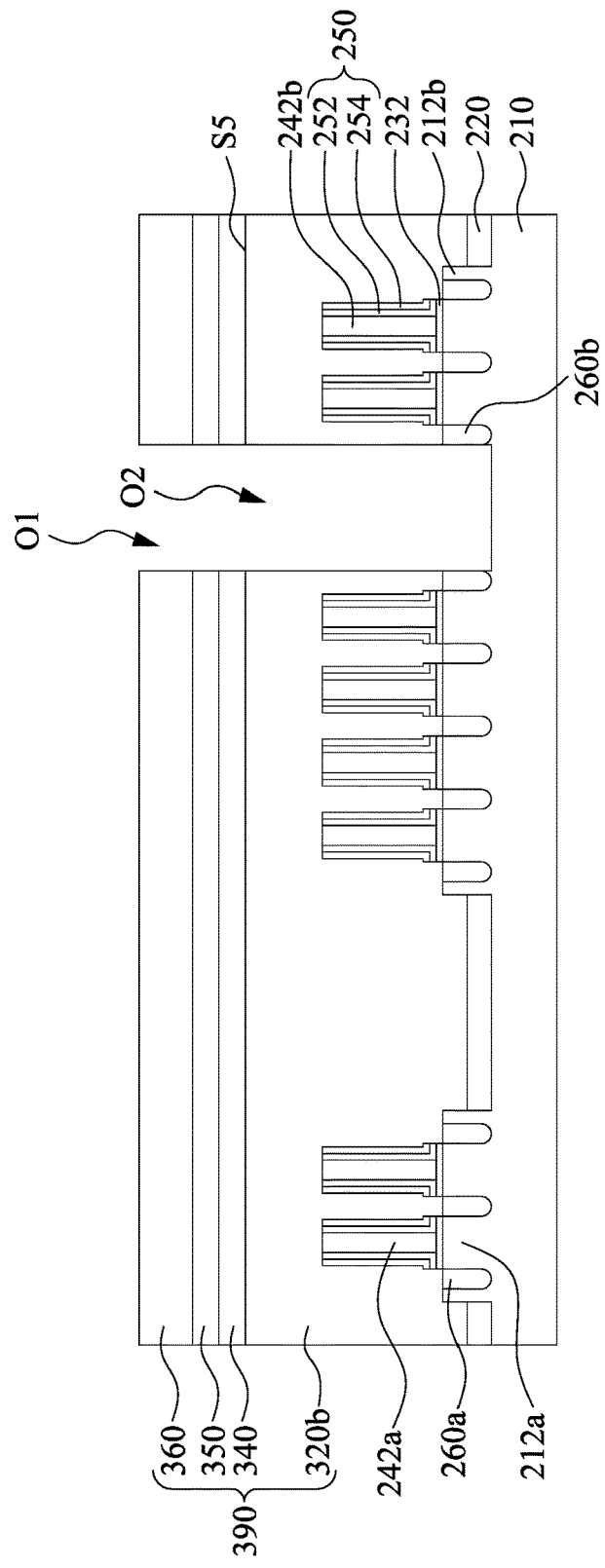
Figure 2P:
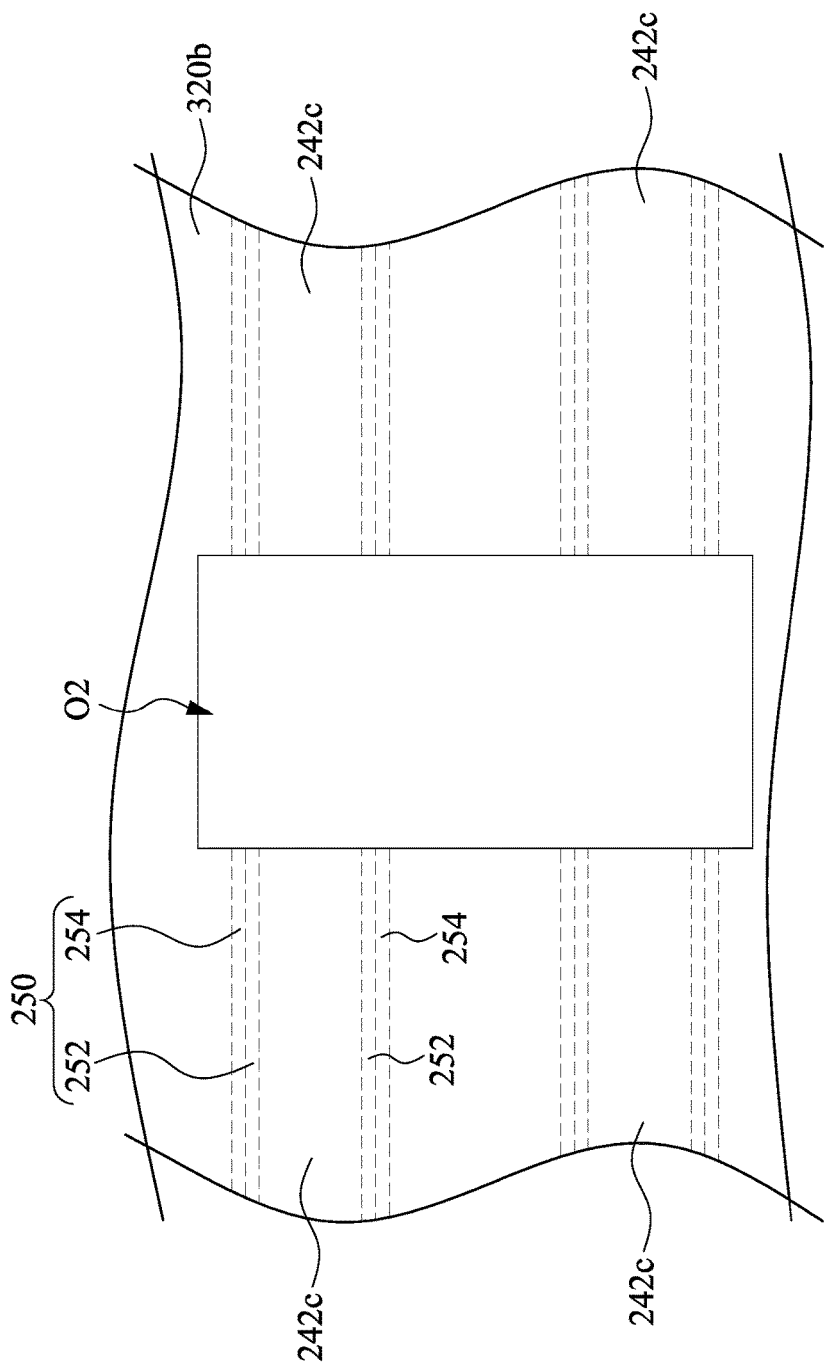
Figure 2Q:
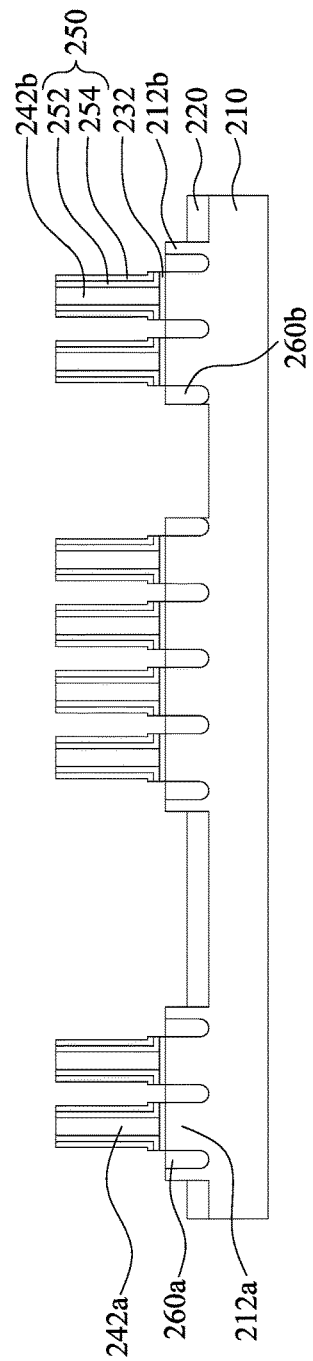
Figure 2R:
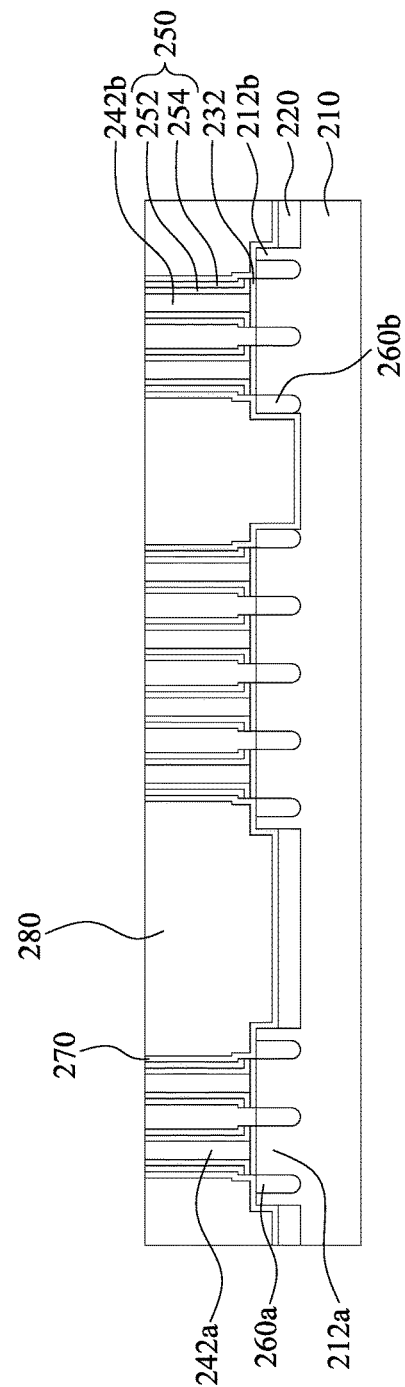
Figure 2S:
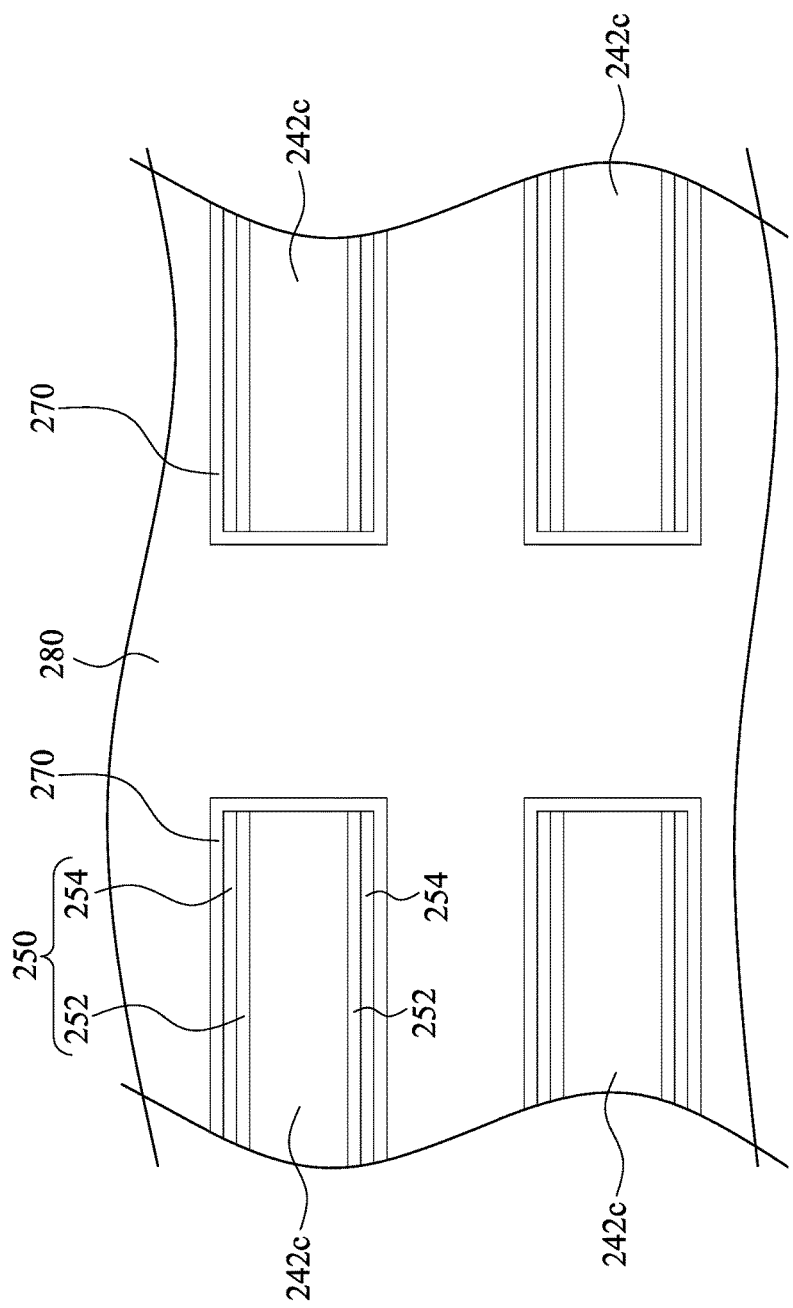
Figure 2T:
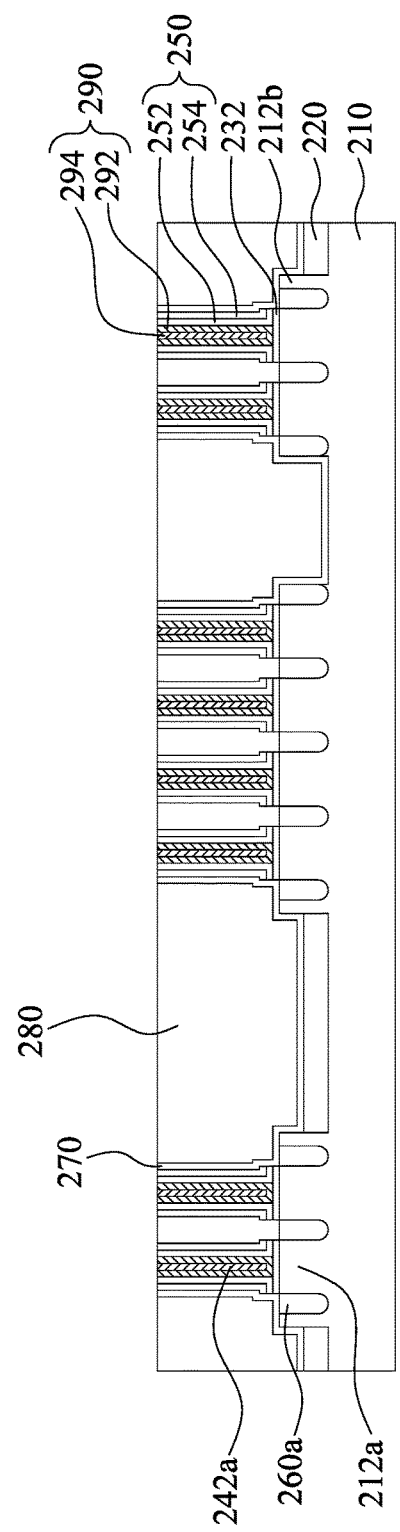
Figure 2U:
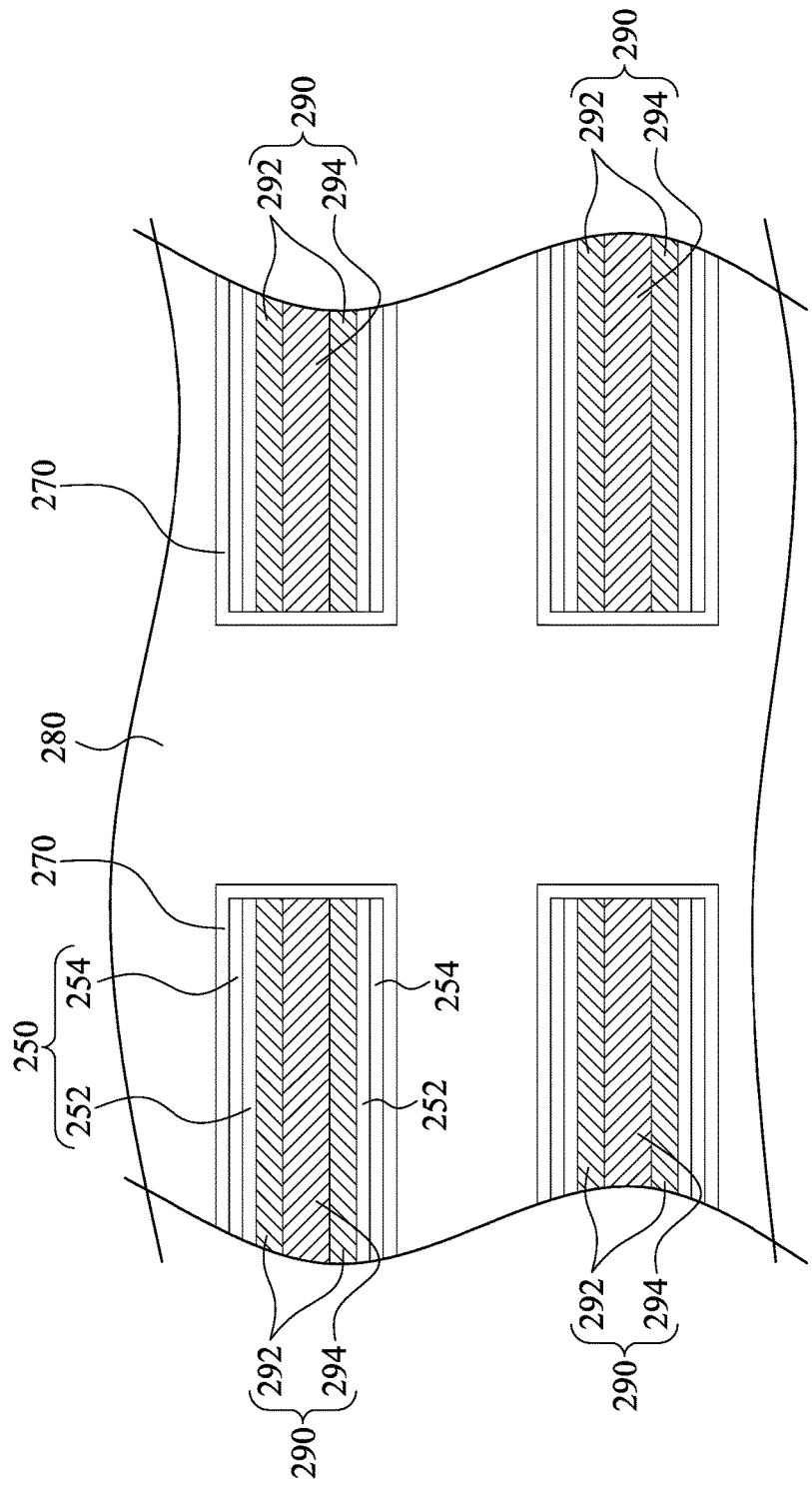

FIGS. 1A and 1B are flow charts showing a method 100 for forming a semiconductor device according to some embodiments of the present disclosure, in which fabrication of a multi-layer mask is included. FIGS. 2A-2U illustrate various processing steps during forming a semiconductor device in accordance with some embodiments. It is understood that additional steps may be implemented before, during, and after the method, and some of the steps described may be replaced or eliminated for other embodiments of the method. The semiconductor structure and the method 100 making the same are collectively described with reference to various figures.

Referring to FIG. 1A, the method 100 begins at block 102 where fins are formed over a substrate. Referring to FIG. 2A, in some embodiments of block 102, semiconductor fins 212a and 212b are formed over a substrate 210. In some embodiments, the substrate 210 may be a semiconductor substrate, such as a bulk semiconductor, a semiconductor-on-insulator (SOI) substrate, or the like. The substrate 210 may be a wafer, such as a silicon wafer. An SOI substrate comprises a layer of a semiconductor material formed on an insulator layer. The insulator layer may be, for example, a buried oxide (BOX) layer, a silicon oxide layer, or the like. The insulator layer is provided on a substrate, which may be a silicon or glass substrate. Other substrates, such as a multi-layered or gradient substrate, may also be used. In some embodiments, the semiconductor material of the substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the semiconductor fins 212a and 212b include silicon and may be formed, for example, by patterning and etching the substrate 210 using photolithography and etching techniques, such that the semiconductor fins 212a and 212b protrude from the substrate 210. For example, a layer of photoresist material (not shown) is deposited over the substrate 210. The layer of photoresist material is irradiated (exposed) in accordance with a predetermined pattern (the semiconductor fins 212a and 212b as shown in FIG. 2A) and developed to remove portions of the photoresist material. The remaining photoresist material protects the underlying material from subsequent processing steps, such as etching. It is noted that other masks, such as an oxide or silicon nitride mask, may also be used in the etching process.

The isolation dielectrics 220 are formed to fill trenches between the semiconductor fins 212a and 212b as shallow trench isolation (STI). The isolation dielectrics 220 may include any suitable dielectric material, such as silicon oxide, silicon nitride, the like, or combinations thereof. The method of forming the isolation dielectrics 220 may include depositing a dielectric material on the substrate 210 to cover the semiconductor fins 212a and 212b, optionally performing a chemical mechanical polish (CMP) process to remove the excess dielectric material outside the trenches, and then performing an etch back process to the dielectric material until upper portions of the semiconductor fins 212a and 212b are exposed. The isolation dielectrics 220 may be deposited using a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials formed by any acceptable process may be used.

It is understood that the processes described above are some examples of how semiconductor fins 212a and 212b and the shallow trench isolation (STI) structure are formed. In other embodiments, a dielectric layer can be formed over a top surface of the substrate 210; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor fins 212a and/or 212b can be recessed, and a material different from the recessed semiconductor fins 212a and/or 212b may be epitaxially grown in their place. In even further embodiments, a dielectric layer can be formed over a top surface of the substrate 210; trenches can be etched through the dielectric layer; heteroepitaxial structures can be epitaxially grown in the trenches using a material different from the substrate 210; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, the semiconductor fins 212a and/or 212b may include silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Returning to FIG. 1A, the method 100 then proceeds to block 104 where a gate dielectric layer and a dummy gate electrode layer are formed over substrate. With reference to FIG. 2B, in some embodiments of block 104, a gate dielectric layer 230 and a dummy gate electrode layer 240 are formed in sequence over the semiconductor fins 212a, 212b and the isolation dielectric 220. In some embodiments, the gate dielectric layer 230 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$-$Al_2O_3$) alloy, or other applicable dielectric materials. In some embodiments, the gate dielectric layer 230 includes an oxide layer. The gate dielectric layer 230 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 230 is formed, the dummy gate electrode layer 240 is formed over the gate dielectric layer 230. In some embodiments, the dummy gate electrode layer 240 may include polycrystalline-silicon (poly-Si), poly-crystalline silicon-germanium (poly-SiGe), metallic nitrides, metallic silicides, metallic oxides, or metals. In some embodiments, the dummy gate electrode layer 240 includes a metal-containing material such as TiN, TaN, TaC, Co, Ru, Al, combinations thereof, or multi-layers thereof. The dummy gate electrode layer 240 may be deposited by CVD, physical vapor deposition (PVD), sputter deposition, or other techniques suitable for depositing conductive materials.

Returning to FIG. 1A, the method 100 then proceeds to block 106 where the dummy gate electrode layer is patterned. With reference to FIG. 2C, in some embodiments of block 106, the dummy gate electrode 240 as shown in FIG. 2B is patterned to form dummy gate electrodes 242a wrapping the semiconductor fin 212a, and dummy gate electrodes 242b wrapping the semiconductor fin 212b. The patterning process may include forming a patterned mask over portions of the dummy gate electrode layer 240 and etching other portions of the dummy gate electrode layer 240 using the patterned mask as an etch mask. After the etching process, the portions of the dummy gate electrode layer 240 covered by the patterned masks remain and form dummy gate electrodes 242a and 242b. The patterned mask may be formed by a series of operations including deposition, photolithography patterning, and etching processes. The patterned mask may be a hard mask for protecting the underlying dummy gate electrode layer 240 against subsequent etching process. The patterned mask is removed after the etching. The dummy gate electrodes 242a and 242b have substantially parallel longitudinal axes that are substantially perpendicular to longitudinal axes of the semiconductor fins 212a and 212b. In some embodiments, neighboring two of the dummy gate electrodes 242a are separated by a first spacing SP1, neighboring two of the dummy gate electrodes 242b are separated by a second spacing SP2, and the dummy gate electrode 242a is separated from the dummy gate electrode 242b by a third spacing SP3. The third spacing SP3 is greater than the first and second spacings SP1 and SP2, thus adversely affecting surface flatness of a subsequently formed spin-on carbon (SOC) layer, which will be discussed in greater detail below.

Returning to FIG. 1A, the method 100 then proceeds to block 108 where gate spacers are formed on opposite sidewalls of the dummy gate electrodes. With reference to FIG. 2D, in some embodiments of block 108, gate spacers 250 are formed on each sidewall of the dummy gate electrodes 242a and 242b. In some embodiments, the gate spacer 250 is a multi-layered spacer and includes an inner spacer layer 252 and an outer spacer layer 254. The inner and outer spacer layers 252 and 254 may include different materials. In some embodiments, the inner and outer spacer layers 252 and 254 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The method of forming the gate spacers 250 includes blanket forming the inner and outer spacer layers 252 and 254 on the structure shown in FIG. 2C using, for example, CVD, PVD or ALD, and then performing an etching process such as anisotropic etching to remove horizontal portions of the inner and outer spacer layers 252 and 254. The remaining portions of the inner and outer spacer layers 252 and 254 on sidewalls of the dummy gate electrodes 242a and 242b can serve as the gate spacers 250. In some embodiments, the etching process also removes the portions of the gate dielectric layer 230 (See FIG. 2C) under the horizontal portions of the inner and outer spacer layers 252 and 254, and portions of the gate dielectric layer 230 remain under respective dummy gate electrodes 242a and 242b after the etching process. The remaining portion of the gate dielectric layer 230 can be referred to as gate dielectric layers 232 in this context. In some embodiments, if the gate dielectric layers 232 are not separated after the spacer layer etching process, one or more etching processes may be performed to the gate dielectric layer 230 after the spacer layer etching process, so as to form separated gate dielectric layers 232.

Returning to FIG. 1A, the method 100 then proceeds to block 110 where epitaxial structures are formed over the substrate 210. With reference to FIG. 2E, in some embodiments of block 110, epitaxial source/drain structures 260a and 260b are formed in the respective fins 212a and 212b. In greater detail, portions of the semiconductor fins 212a and 212b uncovered by the dummy gate electrodes 242a, 242b and the gate spacers 250 are partially removed (or partially recessed) to form recesses 212R1 and 212R2 in the respective semiconductor fins 212a and 212b, and epitaxial source/drain structures 260a and 260b are respectively epitaxially grown in the recesses 212R1 and 212R2 of the semiconductor fins 212a and 212b. Formation of the recesses 212R1 and 212R2 may include a dry etching process, a wet etching process, or combination dry and wet etching processes. This etching process may include reactive ion etch (RIE) using the dummy gate electrodes 242a, 242b and gate spacers 250 as masks. After the etching process, a pre-cleaning process may be performed to clean the recesses 212R1 and 212R2 with hydrofluoric acid (HF) or other suitable solution in some embodiments.

The epitaxial source/drain structures 260a and 260b may be formed using one or more epitaxy or epitaxial (epi) processes, such that Si features, SiGe features, silicon phosphate (SiP) features, silicon carbide (SiC) features and/or other suitable features can be formed in a crystalline state. In some embodiments, lattice constants of the epitaxial source/drain structures 260a and 260b are different from that of the semiconductor fins 212a and 212b, so that the channel region in the semiconductor fins 212a and 212b can be strained or stressed by the epitaxial source/drain structures 260a and 260b to improve carrier mobility of the semiconductor device and enhance the device performance.

Specifically, the electron mobility increases and the hole mobility decreases when the tensile strain is applied in the channel region, and the electron mobility decreases and the hole mobility increases when the compress strain is applied in the channel region. Therefore, an n-type transistor with a stressor configured to provide tensile strain in the channel region would be beneficial, and a p-type transistor with a stressor configured to provide compress strain in the channel region would be beneficial as well. For example, in some embodiments where source/drain structures 260a and/or 260b are used to form n-type transistors, the source/drain structures 260a and/or 260b can act as stressors including, for example, SiP, SiC or SiCP, which is able to induce tensile strain to channels; in some embodiments where source/drain structures 260a and/or 260b are used to form p-type transistors, the source/drain structures 260a and/or 260b may include stressors including SiGe, which is able to induce compress strain to channels.

The epitaxy processes include CVD techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 212a and 212b (e.g., silicon, silicon germanium, silicon phosphate, or the like). The epitaxial source/drain structures 260a and 260b may be in-situ doped. The doping species include p-type dopants, such as boron or $BF_2$; n-type dopants, such as phosphorus or arsenic; and/or other suitable dopants including combinations thereof. If the epitaxial source/drain structures 260a and/or 260b are not in-situ doped, a second implantation process (i.e., a junction implant process) is performed to dope the epitaxial source/drain structures 260a and/or 260b. One or more annealing processes may be performed to activate the epitaxial source/drain structures 260a and/or 260b. The annealing processes include rapid thermal annealing (RTA) and/or laser annealing processes.

Returning to FIG. 1A, the method 100 proceeds to block 112 where a bottom layer of a multi-layer mask is formed over the substrate. With reference to FIG. 2F, in some embodiments of block 112, the bottom layer 320 of a multi-layer mask 390 (See FIG. 2K) may include a carbon-rich material formed using a spin-on coating method. In such embodiments, the bottom layer 320 may be also referred to as a spin-on carbon (SOC) layer 320. In certain embodiments, the carbon-rich material of the bottom layer 320 has a hydroxyl group (—OH) and has a carbon atomic concentration not less than about 50%, which in turn will be advantageous for producing crosslinks in the bottom layer 320 in a following chemical treatment, thus resulting in an improved CMP resistance in a following CMP process, which will be discussed in greater detail below. For example, the carbon atomic concentration is in a range from about 50% to about 70%. If the carbon atomic concentration of the bottom layer 320 is less than about 50%, the crosslinks produced in the bottom layer 320 in the following chemical treatment might be unsatisfactory for the desired CMP resistance. If the carbon atomic concentration is greater than about 70%, the oxygen atomic concentration of the bottom layer 320 might be too low to produce enough crosslinks. The bottom layer 320 may be made of organic material, such as organic polymer (i.e., acrylate, methacrylate, polyester, novolac, polyimide, or other suitable materials), with a hydroxyl group (—OH).

In some embodiments, after the spin-on coating, the bottom layer 320 may be annealed in an annealing gas atmosphere at a temperature in a range from about 150° C. to about 600° C. for a duration in a range from about 30 minutes to about 1 hour. If the annealing temperature is lower than about 150° C. and/or if the annealing duration is less than about 30 minutes, the resulting bottom layer 320 might be too flowable to support a photoresist layer of the multi-layer mask (such as a multi-layer mask 390 illustrated in FIG. 2K). If the annealing temperature is higher than about 600° C. and/or if the annealing duration is greater than about 1 hour, unwanted thermochemical decomposition (e.g., pyrolysis) might occur in the bottom layer 320, and thus the bottom layer 320 might outgas, and the pyrolyzed bottom layer 320 might peel and result in defects in the multi-layer mask. The annealing gas may include air, $N_2$, $O_2$, $H_2$, $N_2/H_2$, $N_2/O_2$, $H_2/O_2$, combinations thereof, or the like. In some embodiments, the bottom layer 320 may be annealed using a single annealing process. In other embodiments, the bottom layer 320 may be annealed using multiple annealing processes.

The bottom layer 320 has an uneven top surface S1 due to the difference between the third spacing SP3 and the first and second spacings SP1, SP2 (See FIG. 2C). To be specific, the bottom layer 320 includes a raised part 322 over the dummy gate electrodes 242a, a raised part 324 over the dummy gate electrodes 242b, and a recessed part 326 between the raised parts 322 and 324. A top of the raised part 324 is separated from a top of the recessed part 326 by a distance D1. In some embodiments, because the number of the dummy gate electrodes 242b is greater than the number of the dummy gate electrodes 242a, the top of the raised part 324 is higher than a top of the raised part 322.

In some embodiments, the thickness of the bottom layer 320 (e.g., a thickness of the recessed part 326) may be in a range from about 0.5 KÅ to about 5 KÅ. If the thickness of the bottom layer 320 is less than about 0.5 KÅ, the bottom layer 320 might be too thin to provide sufficient protect for the gate electrodes 242a and 242b, thus resulting in unwanted damage to the dummy gate electrodes 242a and 242b during the following CMP process. If the thickness of the bottom layer 320 is greater than about 5 KÅ, duration of etching the bottom layer 320 in a following step would be unwantedly lengthy.

Returning to FIG. 1A, the method 100 proceeds to block 114 where a chemical treatment is performed to the bottom layer 320. With reference to FIG. 2G, in some embodiments of block 114, the chemical treatment may include apply a catalyst 400 onto the top surface S1 of the bottom layer 320, thus inducing crosslinks in the bottom layer 320, so as to harden at least a surface layer of the bottom layer 320. The catalyst 400 has a pH value less than about 7 for providing protons ($H^+$) to the bottom layer 320, which in turn will improve production of crosslinks. If the pH value of the catalyst 400 is higher than about 7, the crosslinks in the bottom layer 320 might not occur. After the chemical treatment, the surface layer of the bottom layer 320 is turned into a treated SOC portion 320a, and an underlying portion (also referred to as an underlayer) of the bottom layer 320 under the treated SOC portion 320a may remain untreated and referred to as an untreated SOC portion 320b. The chemical treatment may not influence the topography of the bottom layer 320. For example, topography of the top surface S1 remains substantially unchanged after the chemical treatment.

Figure 3:
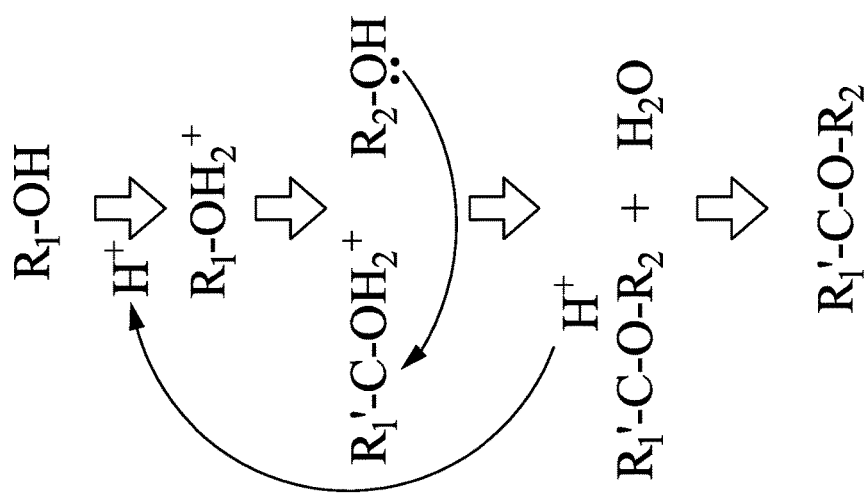
FIG. 3 shows a process of a chemical treatment during a method for fabricating a multi-layer mask according to some embodiments of the present disclosure.

FIG. 3 shows a transformation mechanism resulting from the chemical treatment according to some embodiments of the present disclosure. At beginning of the chemical treatment, the bottom layer 320 (referring to FIG. 2G) provides the molecule $R_1$—OH. $R_1$—OH is one of the molecules of the bottom layer 320. In some embodiments, $R_1$ may be any organic polymer, such as acrylate, methacrylate, polyester, novolac, polyimide, or other suitable polymer.

Thereafter, by applying the catalyst 400 onto the bottom layer 320, protons ($H^+$) are added into $R_1$—OH of the bottom layer 320 (referring to FIG. 2F), which in turn induces a protonation process. For example, one of the hydroxyl groups of $R_1$—OH is catalyzed and protonated to a group $OH_2^+$. Through the protonation process, $R_1$—OH is turn into $R_1$—$OH_2^+$. In some embodiments, the catalyst 400 may be gas-phased or liquid-phased. The catalyst 400 may be Brønsted acid. In some embodiments, the catalyst 400 may be acid, chelating agent, or acid mixed with chelating agent. To be specific, the acid may be $H_2SO_4$, $HClO_4$, HI, HBr, $HNO_3$, HCl, $CH_3COOH$, $C_6H_8O_7$, $KIO_4$, $C_4H_6O_6$, $C_6H_5COOH$, $HBF_4$, $H_2CO_3$, HCN, $HNO_2$, HF, $H_3PO_4$, or the like. The chelating agent may be $C_2H_4(NH_2)_2$ (1,2-diaminoethane), $C_{10}H_8N_2$ (2,2'-Bipyridine), $C_{12}H_8N_2$ (1,10-phenanthroline), $H_2C_2O_4$ (ethanedioic acid), $C_{10}H_{16}N_2O_8$ (ethylenediaminetetraacetic acid, EDTA), or the like.

Subsequently, an intermolecular nucleophilic substitution occurs between $R_1$—$OH_2^+$ and another molecule $R_2$—OH of the bottom layer 320 (as shown in FIG. 2G). It is noted that, $R_1$—C represents $R_1$ in FIG. 3. For example, the hydroxyl group of another molecule $R_2$—OH of the bottom layer 320 attacks the carbon atom of $R_1$—C—$OH_2^+$ of the bottom layer 320, such that the group $OH_2^+$ of $R_1$—C—$OH_2^+$ acts as a good leaving group and may leave the carbon atom. Through the mechanism, two molecules are cross-linked to form the compound $R_1$—C—O—$R_2$ having a proton ($H^+$) with the loss of water ($H_2O$).

In some embodiments, $R_2$ may be any organic polymer, such as acrylate, methacrylate, polyester, novolac, polyimide, or other suitable polymer. In some embodiment, $R_1$ may be identical to $R_2$. In some embodiment, $R_1$ may be different from $R_2$. That is, the bottom layer 320 can be made of one single kind of molecules or at least two kinds of molecules. In some embodiments, the molecules of the bottom layer 320 (e.g., $R_1$—OH and $R_2$—OH) may be suitable molecules having hydroxyl group (—OH), such as alcohols (e.g., primary alcohols, secondary alcohols, or tertiary alcohols), carboxylic acids or other suitable molecules.

Afterwards, the proton ($H^+$) will leave the compound $R_1$—C—O—$R_2$ and serve as the catalyst 400 for adding into $R_1$—OH of the bottom layer 320. The cross-linked compound $R_1$—OH—$R_2$ has a C—O—C linkage, which has an oxide atom connecting two carbon atoms. To be specific, the treated SOC portion 320a (as shown in FIG. 2G) includes the cross-linked compounds $R_1$—O—$R_2$ having the C—O—C linkage, while the untreated SOC portion 320b includes the polymers having the hydroxyl group (—OH), e.g., $R_1$—OH and $R_2$—OH. The crosslinks in the treated SOC portion 320a can improve a resistance to a following CMP process. That is, the treated SOC portion 320a has a higher resistance to a subsequent CMP process than that of the untreated SOC portion 320b. In some embodiments, manganese dioxide may be optionally used in the acid environment for accelerating the leaving of proton ($H^+$) and water ($H_2O$).

A time duration of the chemical treatment is in a range from about 10 minutes to about 2 hours. If the time duration is less than about 10 minutes, the treated SOC portion 320a might be too thin to serve as a CMP stop layer in the following CMP process. If the time duration is longer than about 2 hours, production time might be unnecessarily lengthened. The chemical treatment may be performed in a temperature range from 20° C. to 150° C. If the chemical treatment is performed at a temperature higher than 150° C., the catalyst 400 may be vaporized. If the chemical treatment is performed at a temperature lower than 20° C., time duration of the chemical treatment might be lengthened for forming the treated SOC portion 320a having suitable thickness to serve as a CMP stop layer, which in turn will unnecessarily lengthen production time. In some embodiments, two or more chemical treatments may be performed to the bottom layer 320. In some embodiments, after the chemical treatment, de-ionized water may be used to clear away the remaining catalyst 400. After the cleaning process, a spin dry process may be performed to remove the de-ionized water.

Herein, a dashed line in FIG. 2G indicates the boundary between the treated SOC portion 320a and the untreated SOC portion 320b. In some embodiments, the treated SOC portion 320a and the untreated SOC portion 320b may not have a distinguishable interface therebetween, because the protons added by the catalyst 400 may slowly diffuse in the bottom layer 320. As a result of the diffusion, the crosslinks in the bottom layer 320 (e.g. the ratio of the cross-linked compounds $R_1$—O—$R_2$ to all the molecules) may spatially vary. For example, an upper portion of treated SOC portion 320a close to the top surface S1 has a higher degree of the crosslinks than that of a lower portion of the treated SOC portion 320a. In other words, a percentage of the cross-linked compounds $R_1$—O—$R_2$ in the treated SOC portion 320a may decrease as a distance from the top surface S1 increases. Stated differently, the degree of crosslinks in the treated SOC portion 320a increases as a distance from the untreated SOC portion 320b increases. Since the CMP resistance is in positive correlation with the crosslinks in the SOC, the upper portion of treated SOC portion 320a may have a higher CMP resistance than that of the lower portion of the treated SOC portion 320a.

In some embodiments, the catalyst 400 is applied onto an entire top surface S1 of the bottom layer 320. In some other embodiments, the catalyst 400 is applied to a partial region of the top surface S1, which will be described in greater detail below with respect to FIGS. 6A-6E.

Returning to FIG. 1A, the method 100 proceeds to block 116 where a sacrificial layer is formed over the bottom layer. With reference to FIG. 2H, in some embodiments of block 116, a sacrificial layer 330 is formed over the uneven top surface S1 of the bottom layer 320, and a top surface S2 of the sacrificial layer 330 may have substantially the same surface topography as that of the uneven top surface S1 of the bottom layer 320. The sacrificial layer 330 may include a carbon-rich material, other dielectric materials, semiconductor materials, or the combination thereof. In some embodiments where the sacrificial layer 330 includes a carbon-rich material, the sacrificial layer 330 may be formed using a spin-on coating method and referred to an SOC layer 330. The sacrificial layer 330 may be made of organic polymer, such as acrylate, methacrylate, polyester, novolac, polyimide, or other suitable materials. In some embodiments, the sacrificial layer 330 has a carbon atomic concentration in a range from about 50% to about 99.9%. If the carbon atomic concentration of the SOC layer 330 is less than about 50%, the CMP resistance difference between the SOC layer 330 and the treated SOC portion 320a might be too small to stop the following CMP process using the treated SOC portion 320a.

In some embodiments, the thickness of the SOC layer 330 (e.g., a vertical distance from the top surface S1 to the top surface S2) is in a range from about 0.5 KÅ to about 5 KÅ. If the thickness of the SOC layer 330 is less than about 0.5 KÅ, the SOC layer 330 might be too thin to cover the raised parts 322 and/or 324. If the thickness of the SOC layer 330 is greater than about 5 KÅ, duration of CMP in a following step would be unwanted lengthy.

In some embodiments, the SOC layer 330 is annealed after the spin-on coating. The annealing process may be performed in an annealing gas atmosphere at a temperature in a range from about 150° C. to about 600° C. for a duration in a range from about 30 minutes to about 1 hour. If the annealing temperature is lower than about 150° C. and/or if the annealing duration is less than about 30 minutes, the SOC layer 330 might be too flowable to undergo the following CMP process, which in turn will result in reduced polish uniformity. If the annealing temperature is higher than about 600° C. and/or if the annealing duration is greater than about 1 hour, the SOC layer 330 might outgas, unwanted thermochemical decomposition (e.g., pyrolysis) might occur in the SOC layer 330. The annealing gas may comprise air, $N_2$, $O_2$, $H_2$, $N_2/H_2$, $N_2/O_2$, $H_2/O_2$, combinations thereof, or the like. In some embodiments, the SOC layer 330 is annealed using a single annealing process. In other embodiments, the SOC layer 330 may be annealed using multiple annealing processes.

In alternative embodiments, the sacrificial layer 330 may be made of a material different from SOC. For example, the sacrificial layer 330 includes $SiO_2$, $HfO_2$, $ZrO_2$, $La_2O_3$, $Al_2O_3$, $TiO_2$, $Ta_2O_5$, SiN, SiC, SiON, AlON, SiOC, SiCN, SiONC, Si, SiGe, Ge, SiP, GaAs, InP, the like, or combinations thereof, and may be formed using CVD, PECVD, ALD, the like, or combinations thereof.

Returning to FIG. 1A, the method 100 proceeds to block 118 where the sacrificial layer 330 is planarized. With reference to FIG. 2I, in some embodiments of block 118, the sacrificial layer 330 is planarized until reaching the treated SOC portion 320a. In some embodiments, the sacrificial layer 330 may be planarized using a CMP process. In greater detail, CMP utilizes a reagent within slurry to react chemically with the front uneven top surface S2 of the sacrificial layer 330 (referring to FIG. 2H), and produce an easily polished layer. Such slurry may contain some active polishing ingredients such as abrasive particles. The abrasive particles are made of titanium oxide, silicon oxide or cerium oxide, for example. Together with the abrasive action provided by the abrasive particles in the slurry under a polishing pad, the sacrificial layer 330 is gradually removed.

Figure 4:
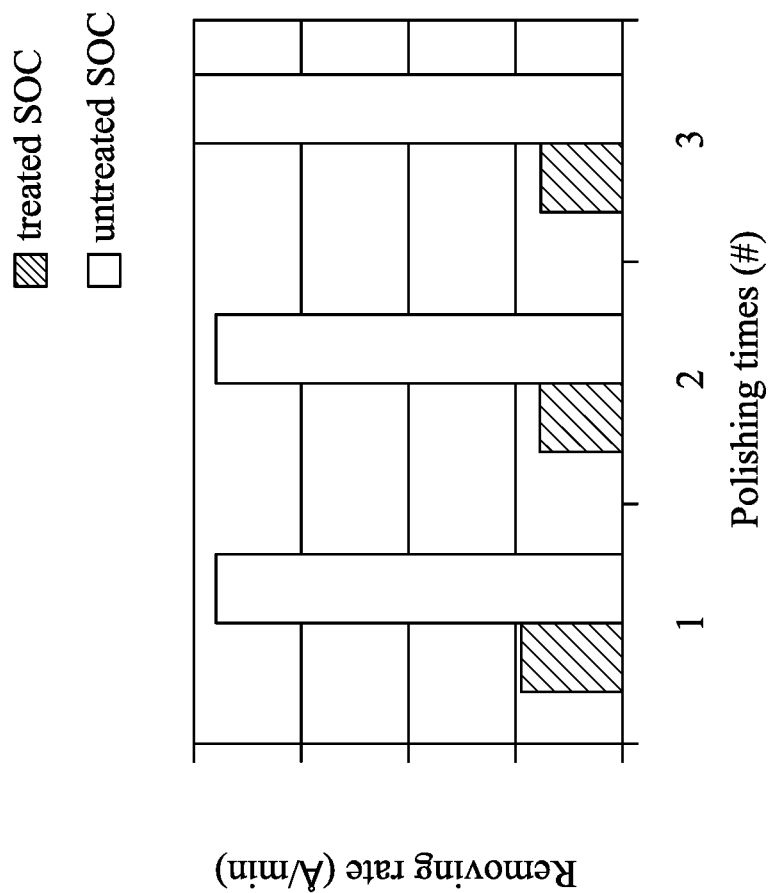
FIG. 4 shows removing rates of treated and untreated SOC layers in a polishing process during a method for fabricating a multi-layer mask according to some embodiments of the present disclosure.

Herein, the determination of the polishing end point is made clearer by the aforementioned chemical treatment. In greater detail, the treated SOC portion 320a has CMP selectivity with respect to the untreated SOC layer 330 because the treated SOC portion 320a has higher degree of crosslinks than that of the untreated SOC layer 330. In this way, the treated SOC portion 320a can function as a CMP stop layer in the CMP process. To be specific, the treated SOC portion 320a has a higher resistance to the CMP process than that of the untreated SOC layer 330. That is to say, the treated SOC has a higher resistance to the slurry than that of the untreated SOC. For example, FIG. 4 shows removing rates of the treated SOC (e.g., the treated SOC portion 320a) and the untreated SOC (e.g., the untreated SOC layer 330 or the untreated SOC portion 320b) in the CMP process. The removing rate of the treated SOC may be lower than about 500 Å/min, while the removing rate of the untreated SOC may be greater than about 1500 Å/min.

Therefore, the removing rate of the untreated SOC is at least three times the removing rate of the treated SOC. As such, the polishing end point can be made clear by using treated SOC as the CMP stop layer because the treated SOC can significantly slow down the CMP process. Therefore, the CMP process can be stopped as long as the treated SOC portion 320a is exposed, thus resulting in a top surface S3 of the treated SOC portion 320a substantially level with a top surface S4 of the sacrificial layer 330. On the contrary, if the removing rate of the treated SOC is higher than about 500 Å/min and/or the removing rate of the untreated SOC is lower than about 1500 Å/min, the polishing end point might be unclear, thus resulting in a CMP dishing effect. The treated SOC portion 320a and the untreated SOC layer 330 can be in combination form a top surface which has improved flatness compared to the uneven top surface S1 of the bottom layer 320 (See FIG. 2H). Moreover, because the CMP process can be stopped as long as the treated SOC portion 320a is exposed, over-polishing of the bottom layer 320 can be prevented, which in turn will protect the dummy gate electrodes 242a, 242b and/or spacers 250 from damage due to the over-polishing.

After the CMP process, de-ionized water may be used to clear away residue resulting from the CMP process, such as the slurry and abrasive particles on the substrate 210. After the cleaning, one or more annealing processes may be optionally performed to the substrate 210 for further hardening the SOC layers 320 and 330. The annealing processes may be performed with a temperature ranging from about 150° C. to about 600° C. for a duration of about 30 minutes to about 1 hour, with an ambient gas, such as atmosphere, $N_2$, $O_2$, $H_2$, $N_2/H_2$, $N_2/O_2$, or $H_2/O_2$. If the annealing temperature is lower than about 150° C. and/or if the annealing duration is less than about 30 minutes, the SOC layers 320 and 330 might be too flowable to undergo a following etching process. If the annealing temperature is higher than about 600° C. and/or if the annealing duration is greater than about 1 hour, unwanted thermochemical decomposition (e.g., pyrolysis) might occur in the SOC layers 320 and/or 330, the SOC layers 320 and 330 might outgas, and the pyrolyzed SOC layers 320 and 330 might peel and result in defects in the multi-layer mask (such as a multi-layer mask 390 illustrated in FIG. 2K).

Returning to FIG. 1A, the method 100 proceeds to block 120 where a non-selective etching back process is performed to the bottom layer and the sacrificial layer. Reference is made to FIG. 2J, in some embodiments of block 120, the sacrificial layer 330 and the bottom layer 320 are non-selectively etched back. The non-selective etching back process results in removing the untreated SOC layer 330 and the treated SOC portion 320a, while remaining the untreated SOC portion 320b over the substrate 210. In this context, the "non-selective etching" means that a difference between etching rates of two layers is within about 10 percent of one of the etching rates. In some embodiments, a ratio between etching rates of two layers (e.g., untreated SOC and treated SOC) can be in a range from about 0.25 to about 4. In this way, a top surface S5 of the remaining untreated SOC portion 320b will have improved flatness compared to the uneven top surface S1 of the bottom layer 320 (See FIG. 2E), so as to improve flatness of a photoresist layer subsequently formed over the remaining untreated SOC portion 320b, which will be described in greater detail below.

In some embodiments, the non-selective etching back process includes a plasma etching process using an etchant having a sulfur-containing gas and an oxygen-containing gas. For example, the sulfur-containing gas may be $SO_2$, and the oxygen-containing gas may be $O_2$. In greater detail, a gas volume ratio of the oxygen-containing gas to the sulfur-containing gas may be in a range from about 2 to about 5. If the gas volume ratio of the oxygen-containing gas to the sulfur-containing gas is greater than about 5, the etching rate of the treated and untreated SOC might be too high to control, and unwanted lateral etching might increase as well. If the gas volume ratio of the oxygen-containing gas to the sulfur-containing gas is less than about 2, etching rate of the treated and untreated SOC might be too low and thus results in undesirably lengthy etching duration.

Figure 5:
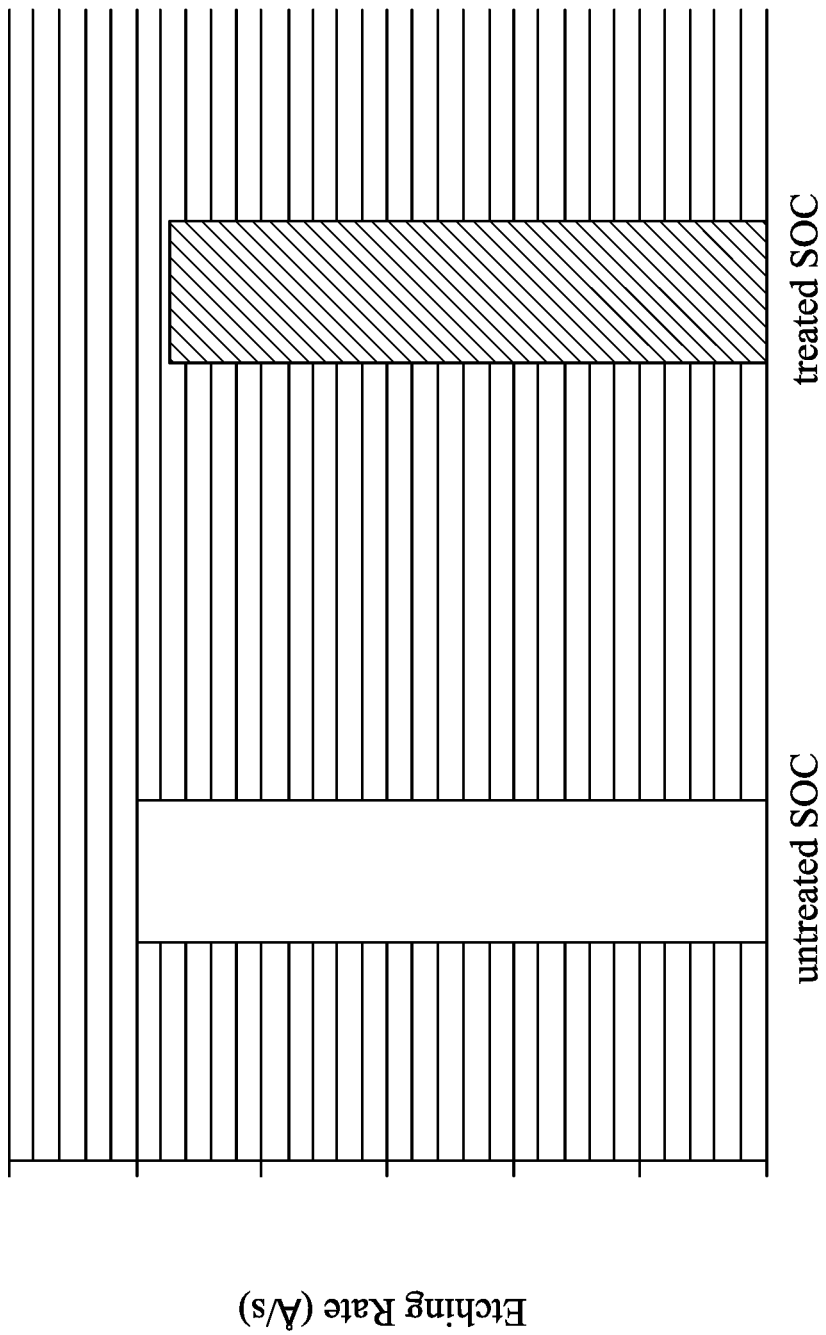
FIG. 5 shows etching rates of treated and untreated SOC layers in an etching process during a method for fabricating a multi-layer mask according to some embodiments of the present disclosure.

FIG. 5 shows etching rates of treated and untreated SOC in the non-selective etching process according to some embodiments of the present disclosure. As illustrated in FIG. 5, an etch rate of the treated SOC (e.g., the treated SOC portion 320a) may be substantially the same as an etch rate of the untreated SOC (e.g., the untreated SOC portion 320b and the untreated SOC layer 330). For example, the etch rate ratio of the treated SOC to the untreated SOC is in a range from about 0.9 to about 1.1. If the etching rate ratio of the treated SOC to the untreated SOC is greater than about 1.1 or less than about 0.9, the top surface S5 of the remaining untreated SOC portion 320b might have unsatisfactory flatness, which in turn will result in an uneven photoresist layer subsequently formed over the top surface S5, which in turn will lead to lithography issues in a following lithography process (e.g., exposure light might be out of focus due to the uneven photoresist layer).

Referring to FIG. 1B, the method 100 proceeds to block 122 where one or more middle layers and a top layer are formed over the untreated SOC portion to form a multi-layer mask. With reference to FIG. 2K, in some embodiments of block 122, a first middle layer 340, an optional second middle layer 350 and a top layer 360 are formed in sequence over the untreated SOC portion 320b to form the multi-layer mask 390. In some embodiments, the first middle layer 340 may comprise an inorganic silicon-containing material, such as silicon oxycarbide (SiOC), or the like. In some embodiments, the first middle layer 340 may be formed using spin-on coating, CVD, PECVD, ALD, the like, or a combination thereof. In some embodiments, the first middle layer 340 may act as an inorganic hard mask layer. In other embodiments, the first middle layer 340 may act as an inorganic bottom anti-reflective coating (BARC) layer.

The second middle layer 350 is optionally formed over the first middle layer 340. In some embodiments, the second middle layer 350 may act as an organic bottom anti-reflective coating (BARC) layer. In some embodiments, the second middle layer 250 may include a suitable organic material and may be formed using spin-on coating, or the like. The second middle layer 350 is formed to a thickness sufficient to provide sufficient antireflective qualities based upon the materials and the wavelength. In alternative embodiments, the second middle layer 350 may be omitted.

The top layer 360 is formed over the second middle layer 350. In some embodiment, the top layer 360 includes a photoresist material and may be formed using spin-on coating, or the like. Thus, the top layer 360 can be referred to as a photoresist layer in this context. In some embodiment, the untreated SOC portion 320b, the first middle layer 340, the second middle layer 350, and the top layer 360 are in combination referred to as the multi-layer mask 390. As shown in FIG. 2K, because the first, second middle layers 340, 350 and the top photoresist layer 360 are stacked over the flattened top surface S5 of the untreated SOC portion 320b, a top surface S6 of the top photoresist layer 360 can have improved flatness, thus addressing photolithography issues (e.g., out of focus of the exposure light because of an uneven photoresist layer).

Returning to FIG. 1B, the method 100 proceeds to block 124 where the top layer is patterned. With reference to FIG. 2L, in some embodiments of block 124, the top layer 360 is irradiated (exposed) and developed, thus resulting in an opening O1 in the top layer 360. The opening O1 in the top layer 360 is above one or more dummy gate electrodes (e.g., dummy gate electrodes 242b), so that the multi-layer mask 390 can be used as an etch mask for a following gate cut process.

Flatness of a photoresist layer (e.g., the top layer 360) has many impacts on the photolithography result. For example, an exposure tool used in irradiating a photoresist layer has a focus budget, which refers to a minimum depth of focus (DOF) of a photolithography process to cover focus variation of the exposure tool. Poor flatness of a photoresist layer would lead to deteriorated focus variation, thus resulting in a negative impact on the focus budget. Moreover, critical dimension (CD) of various patterns formed using photolithography techniques is expected to be uniform across a wafer, and the CD uniformity is attributed to at least the flatness of the photoresist layer. More particularly, CD uniformity is in positive correlation with the flatness of the photoresist layer. Stated differently, poor flatness of a photoresist layer would lead to reduced CD uniformity. For example, if the photoresist layer is uneven, a result of after development inspection (ADI) would show poor CD uniformity in the patterned photoresist layer. However, because blocks 112-122 of FIGS. 1A and 1B result in the photoresist layer 360 with improved flatness, the focus budget and/or the CD uniformity can be improved.

Returning to FIG. 1B, the method 100 proceeds to block 126 where the middle layers and the untreated SOC portion are patterned. With reference to FIGS. 2M and 2N, in some embodiments of block 126, a patterning process is performed to transfer the opening O1 in the top photoresist layer 360 to the underlying middle layers 350, 340, and the untreated SOC portion 320b, thus resulting in an opening O2 in the untreated SOC portion 320b to expose one or more dummy gate electrodes 242b to be etched. In some embodiments, the patterning process comprises one or more etching processes, and the top photoresist layer 360 is used as an etch mask. The one or more etching processes may include anisotropic wet etching processes, anisotropic dry etching processes, or combinations thereof. In some embodiments, the untreated SOC portion 320b is etched using an etchant substantially the same as the etchant used in the non-selective etching back as illustrated in FIG. 2J. For example, the etching process includes a plasma etching process using an etchant having a sulfur-containing gas and an oxygen-containing gas. For example, the sulfur-containing gas may be SO₂, and the oxygen-containing gas may be O₂. In greater detail, a gas volume ratio of the oxygen-containing gas to the sulfur-containing gas may be in a range from about 2 to about 5. If the gas volume ratio of the oxygen-containing gas to the sulfur-containing gas is greater than about 5, the etching rate of the untreated SOC might be too high to control, and unwanted lateral etching might increase as well. If the gas volume ratio of the oxygen-containing gas to the sulfur-containing gas is less than about 2, etching rate of the untreated SOC might be too low and thus results in undesirably lengthy etching duration.

Returning to FIG. 1B, the method 100 proceeds to block 128 where a gate cut process is performed to the dummy gate electrodes exposed by the untreated SOC portion. With reference to FIGS. 2O and 2P, the dummy gate electrodes 242b exposed by the opening O2 are etched using the untreated SOC portion 320b as an etch mask. In this way, the dummy gate electrodes 242b exposed by the untreated SOC portion 320b each are break (or cut) into a plurality of dummy gate electrodes 242c (See the illustrative top view as shown in FIG. 2P), and thus this etching process can be referred to as the gate cut process. In some embodiments, the gate spacers 250, a portion of the semiconductor fin 212b and the epitaxy source/drain structure 260b under the opening O2 are etched as well. The etching includes one or more anisotropic wet etching processes, anisotropic dry etching processes, or combinations thereof. The middle layers 340 and 350 may be consumed during the etching process.

Returning to FIG. 1B, the method 100 proceeds to block 130 where the untreated SOC portion is removed. In some embodiments of block 130, the remaining untreated SOC portion 320b is removed by an etching process. The resulting structure is shown in FIG. 2Q. For example, the etch process includes a plasma etching process using an etchant having a sulfur-containing gas (e.g., SO₂) and an oxygen-containing gas (e.g., O₂).

Returning to FIG. 1B, the method 100 proceeds to block 132 where a contact etch stop layer (CESL) and an interlayer dielectric (ILD) layer are formed over the substrate. With reference to FIGS. 2R and 2S, in some embodiments of block 132, a CESL 270 and an ILD layer 280 are formed over the substrate 210. Formation of the CESL 270 and the ILD layer 280 includes depositing the CESL 270 and the ILD layer 280 in sequence over the substrate 210, followed by performing a CMP process to the ILD layer 280 until reaching the dummy gate electrodes 242a and 242b. The CESL 270 includes silicon nitride, silicon oxynitride or other suitable materials and can be deposited using, for example, plasma enhanced CVD, low pressure CVD, ALD or other suitable techniques. Materials of the ILD layer 280 may be different from that of the CESL 270. In some embodiments, the ILD layer 280 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 280 may be deposited using, for example, CVD, ALD, spin-on-glass (SOG) or other suitable techniques.

Returning to FIG. 1B, the method 100 proceeds to block 134 where the dummy gate electrodes are replaced with replacement gate electrodes, respectively. With reference to FIGS. 2T and 2U, in some embodiments of block 134, the dummy gate electrodes 242a, 242b and 242c (as shown in FIGS. 2R and 2S) are replaced with replacement gate electrodes 290 (also referred to as metal gate electrodes) using a "gate-last" or replacement-gate process. For example, the dummy gate electrodes 242a, 242b and 242c are removed to form gate trenches between the spacers 250, and replacement gate electrodes 290 are formed in the gate trenches. Formation of the replacement gate electrodes 290 may include blanket depositing one or more work function metal layers 292 in the gate trenches, depositing a fill metal 294 over the work function metal layer, and removing excess portions of the one or more work function metal layers and the fill metal outside the gate trenches using an CMP process, such that remaining portions of the work function metal layers 292 and the fill metal 294 can serve as the replacement gate electrodes 290.

The work function metal layer 292 may include one or more n-type work function metals (N-metal) for forming an n-type transistor. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function metal layer 292 may include one or more p-type work function metals (P-metal) for forming a p-type transistor. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the work function metal layer is formed by ALD process. The fill metal 294 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, the fill metal is formed by ALD process.

Figure 6A:
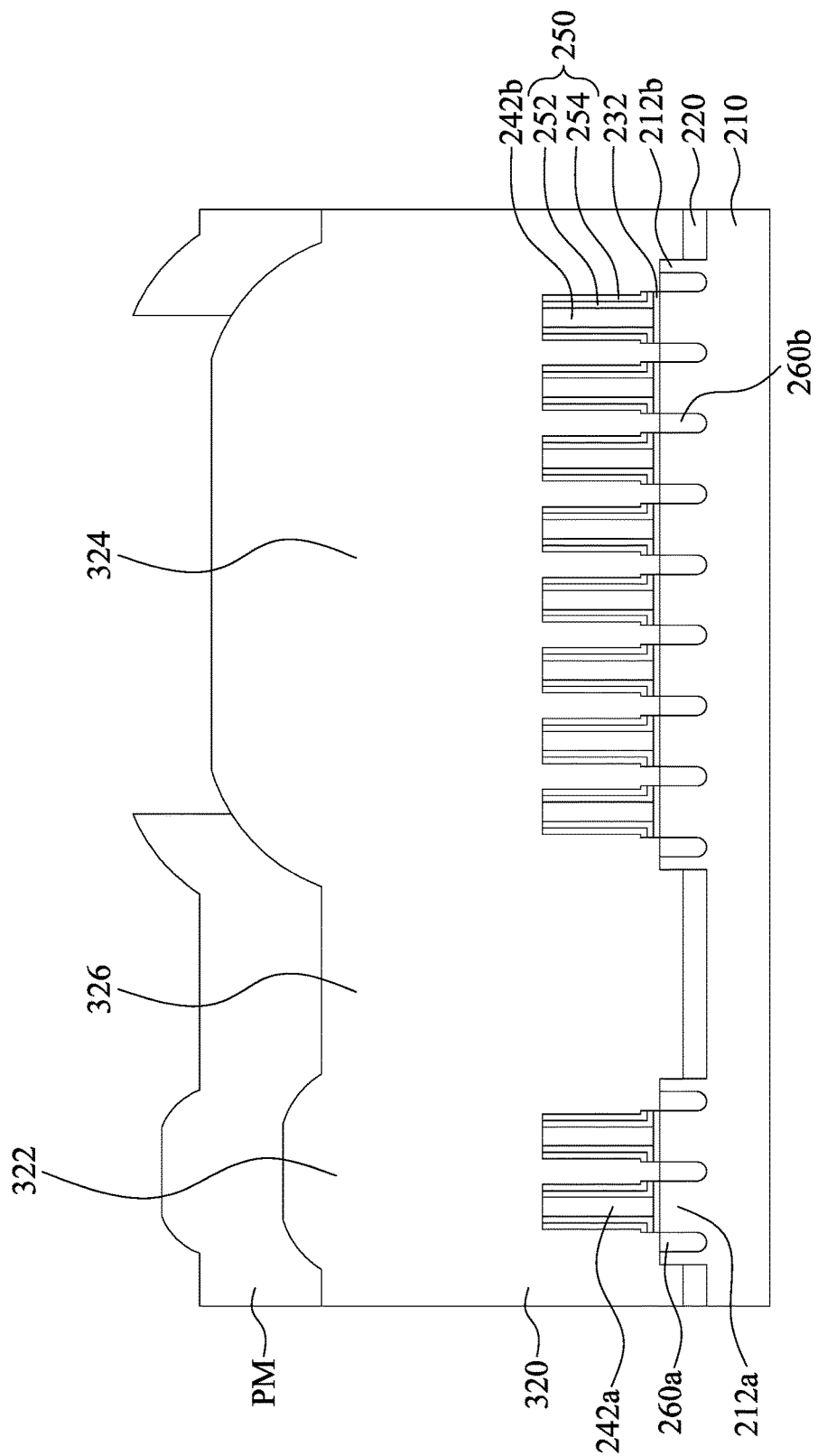
FIGS. 6A-6E are cross-sectional views of various processing steps during forming a semiconductor device in accordance with some embodiments.

FIGS. 6A-6E are cross-sectional views of various processing steps during forming a semiconductor device in accordance with some embodiments. The steps of FIG. 6A-6E may be performed after the step as illustrated in FIG. 2F. Referring to FIG. 6A, a patterned mask PM is formed over the raised part 322 and the recessed part 326 of the bottom layer 320, and exposes the raised part 324 of the bottom layer 320. In some embodiments, the patterned mask PM may be made of suitable photoresist material and patterned by suitable lithography process. The photoresist material may be formed using spin-on coating, or the like.

Figure 6B:
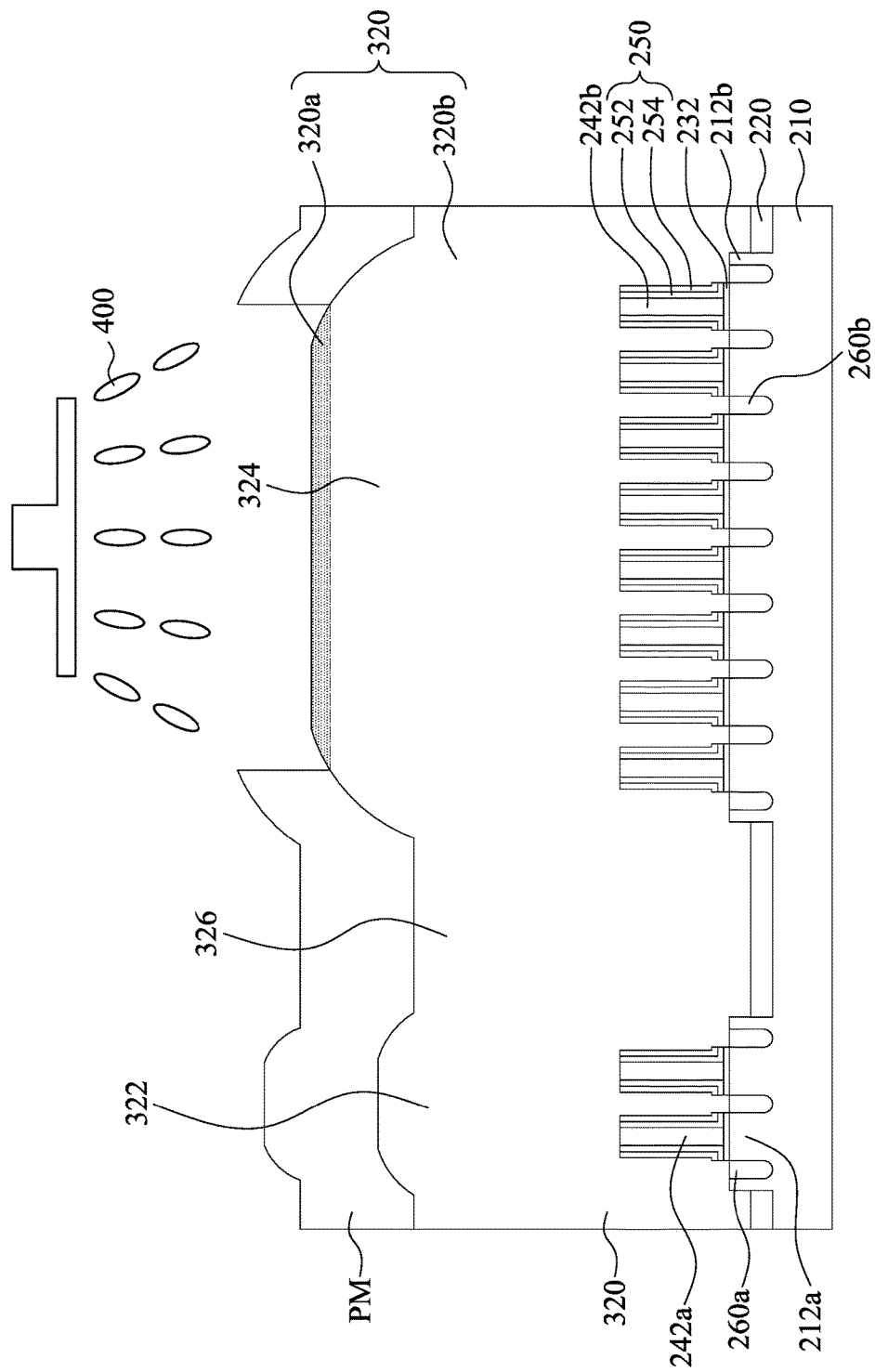

Subsequently, referring to FIG. 6B, the catalyst 400 is applied onto the raised part 324, such that a surface layer of the raised part 324 of the bottom layer 320 is chemically treated and referred to as a treated SOC portion 320a hereinafter. Another portion of the bottom layer 320 covered by the patterned mask PM remain untreated and is referred to as an untreated SOC portion 320b hereinafter. The description of the chemical treatment is discussed previously with respect to block 114 of the method 100 as shown in FIG. 1A and thus not repeated herein for the sake of brevity.

Figure 6C:
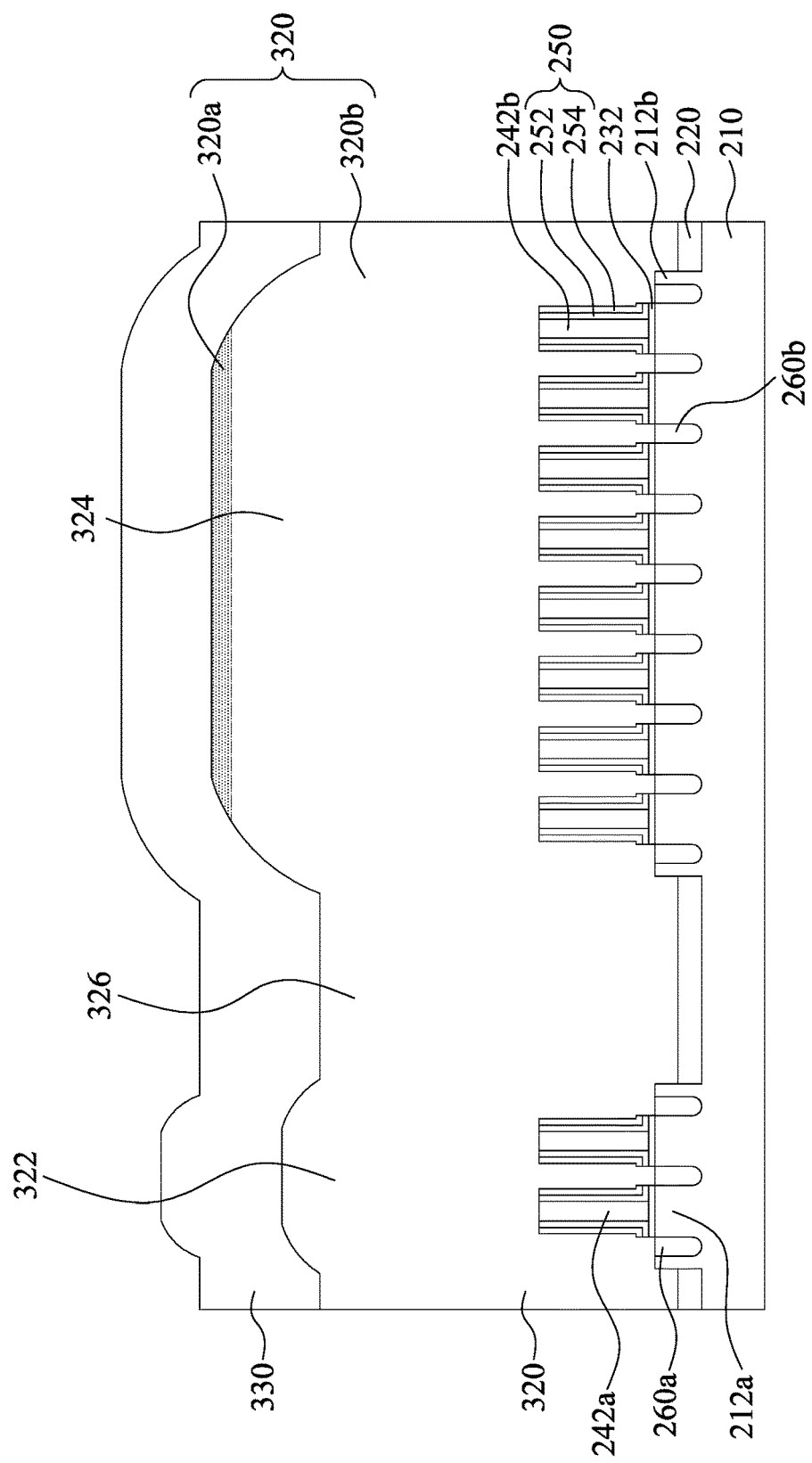

Referring to FIG. 6C, the sacrificial layer 330 is formed over the bottom layer 320. In the present embodiments, the sacrificial layer 330 may be in contact with the untreated SOC portion 320b and the treated SOC portion 320a. The description of the formation of the sacrificial layer 330 is discussed previously with respect to block 116 of the method 100 as shown in FIG. 1A and thus not repeated herein for the sake of brevity.

Figure 6D:
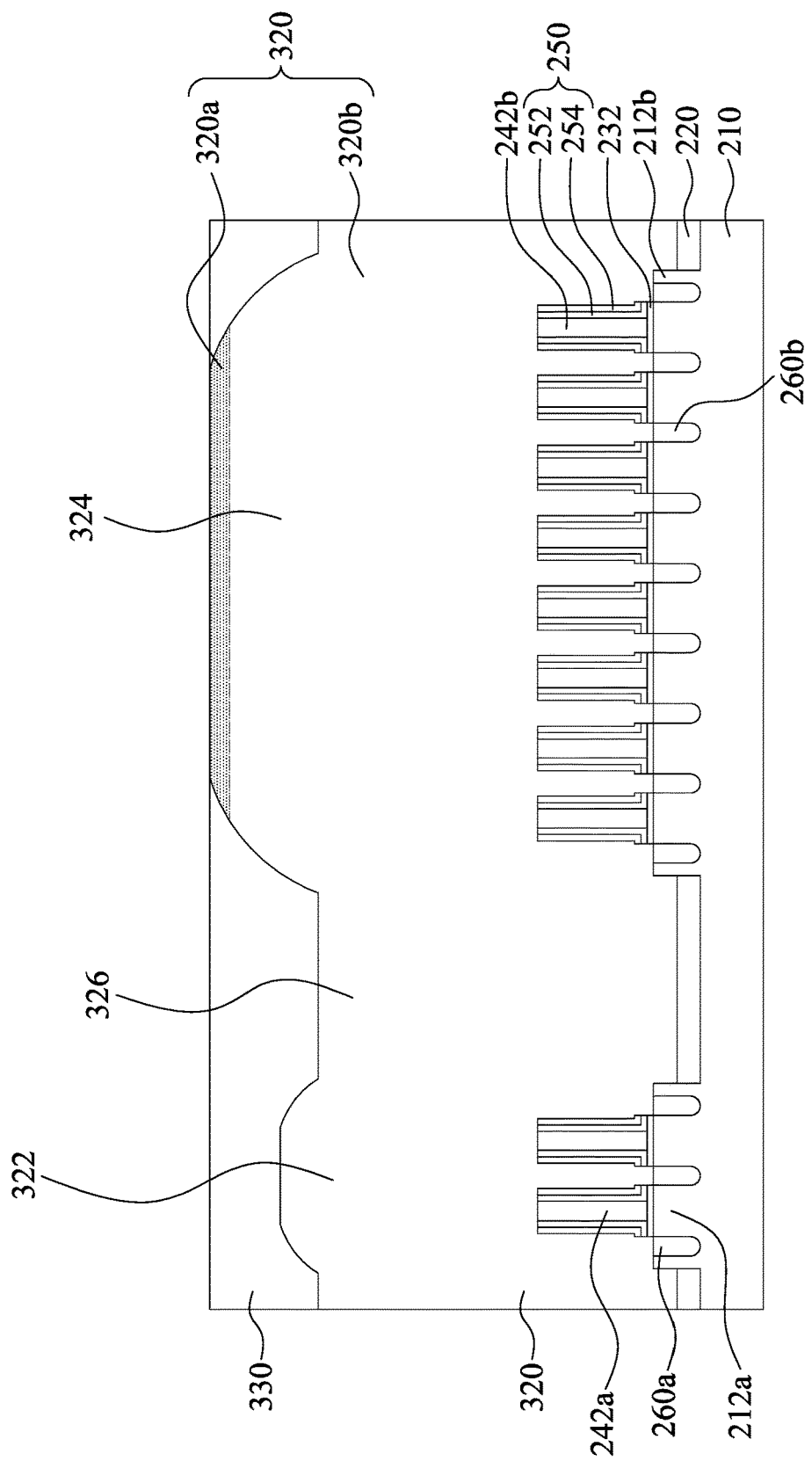

Referring to FIG. 6D, the sacrificial layer 330 is planarized until reaching the treated SOC portion 320a, for example, using a CMP process. The treated SOC portion 320a has CMP selectivity with respect to the untreated SOC layer 330 because the treated SOC portion 320a has higher degree of crosslinks than that of the untreated SOC layer 330. In this way, the treated SOC portion 320a may function as a CMP stop layer in the planarization process. The description of the planarization process is discussed previously with respect to block 118 of the method 100 as shown in FIG. 1A and thus not repeated herein for the sake of brevity.

Figure 6E:
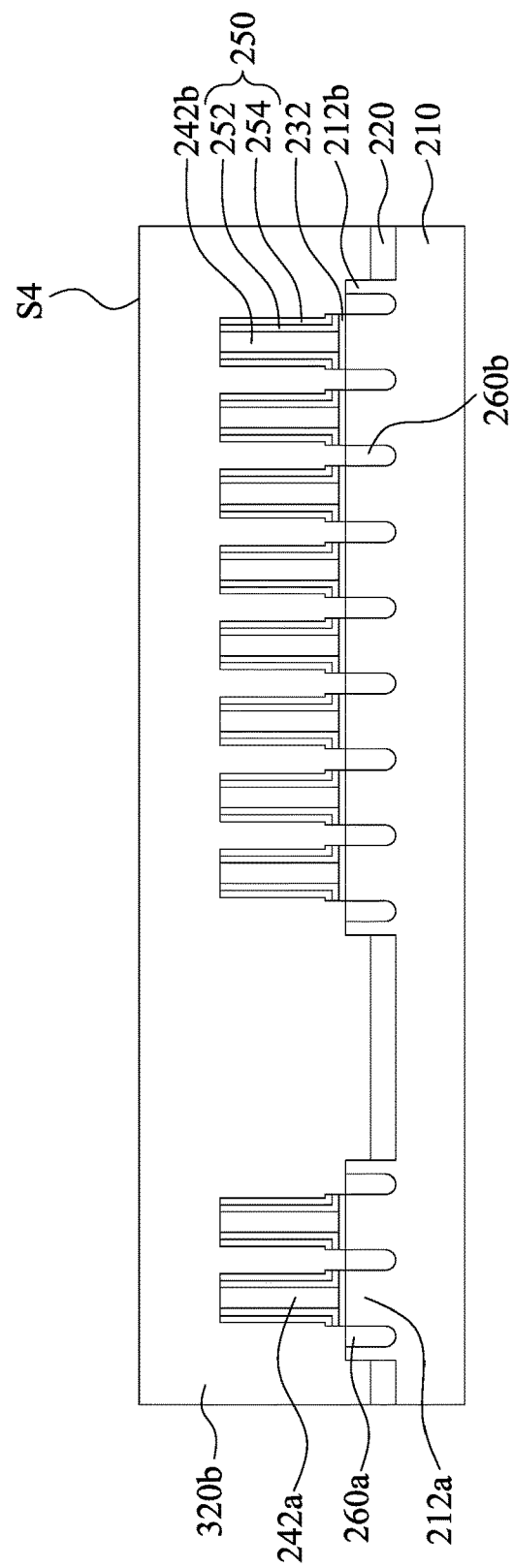

Referring to FIG. 6E, the sacrificial layer 330 and the bottom layer 320 (see FIG. 6D) are non-selectively etched back. The non-selective etching back process results in removing the untreated SOC layer 330 and the treated SOC portion 320a, while remaining the untreated SOC portion 320b over the substrate 210. The non-selective etching back process results in a top surface of the remaining untreated SOC portion 320b with improved flatness compared to the uneven top surface of the bottom layer 320 (See FIG. 6D), so as to improve flatness of a photoresist layer of a multi-layer mask subsequently formed over the remaining untreated SOC portion 320b. The description of the non-selective etching back process is discussed previously with respect to block 120 of the method 100 as shown in FIG. 1A and thus not repeated herein for the sake of brevity. After the non-selective etching back process, blocks 122-134 of the method 100 as shown in FIG. 1B are performed.

Based on the above discussions, it can be seen that the present disclosure offers advantages. It is understood, however, that other embodiments may offer additional advantages, and not all advantages are necessarily disclosed herein, and that no particular advantage is required for all embodiments. One example advantage is that the flatness of a photoresist layer is improved, which in turn will result in improved focus budget and/or CD uniformity in the patterned photoresist layer. Another advantage is that damage to the structures (e.g., gate electrodes, spacers, and/or fins) under the SOC layer resulting from the CMP process performed to the SOC layer can be prevented, because the CMP process can be stopped as long as the treated surface layer of the SOC layer is exposed.

According to some embodiments of the present disclosure, a method includes forming a spin-on carbon (SOC) layer over a target structure; chemically treating an upper portion of the SOC layer; forming a sacrificial layer over the SOC layer; performing a chemical mechanical polish (CMP) process on the sacrificial layer until reaching the SOC layer, wherein the chemically treated upper portion of the SOC layer has a higher resistance to the CMP process than that of the sacrificial layer; forming a patterned photoresist layer over the SOC layer after the CMP process; and etching the target structure using the patterned photoresist layer as a mask.

According to some embodiments of the present disclosure, a method includes forming a spin-on carbon (SOC) layer over a target structure; chemically treating an upper portion of the SOC layer; forming a sacrificial layer over the chemically treated upper portion of the SOC the SOC layer; polishing the sacrificial layer until the chemically treated upper portion of the SOC layer is exposed; non-selectively etching the treated surface layer of the SOC layer and the sacrificial layer; and non-selectively etching the SOC layer and the sacrificial layer.

According to some embodiments of the present disclosure, a method includes forming a spin-on carbon (SOC) layer over a target structure; chemically treating an upper portion of the SOC layer, such that the upper portion of the SOC layer has a higher degree of crosslinks than a bottom portion of the SOC layer; forming a sacrificial layer over the SOC layer; polishing the sacrificial layer until reaching the SOC layer; forming a patterned photoresist layer over the SOC layer after polishing the sacrificial layer; and using etching the target structure using the patterned photoresist layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a spin-on carbon (SOC) layer over a target structure;
chemically treating an upper portion of the SOC layer;
forming a sacrificial layer over the SOC layer;
performing a chemical mechanical polish (CMP) process on the sacrificial layer until reaching the SOC layer, wherein the chemically treated upper portion of the SOC layer has a higher resistance to the CMP process than that of the sacrificial layer;
forming a patterned photoresist layer over the SOC layer after the CMP process; and
etching the target structure using the patterned photoresist layer as a mask.

2. The method of claim 1, wherein chemically treating the upper portion of the SOC layer comprises:
applying a catalyst onto the upper portion of the SOC layer.

3. The method of claim 2, wherein the catalyst has a pH value less than about 7.

4. The method of claim 1, wherein the sacrificial layer comprises an SOC material.

5. The method of claim 1, wherein chemically treating the upper portion of the SOC layer is performed such that a bottom portion of the SOC layer has a lower resistance to the CMP process than that of the chemically treated upper portion of the SOC layer.

6. The method of claim 1, wherein chemically treating the upper portion of the SOC layer is performed such that the chemically treated upper portion of the SOC layer comprises a compound having a C—O—C linkage.

7. The method of claim 1, wherein forming the sacrificial layer comprises:
depositing a dielectric material over the SOC layer.

8. The method of claim 1, wherein forming the sacrificial layer comprises:
depositing a semiconductor material over the SOC layer.

9. The method of claim 1, further comprising:
performing an etching process to etch the chemically treated upper portion of the SOC layer and the sacrificial layer after the CMP process.

10. The method of claim 9, wherein the chemically treated upper portion of the SOC layer has a first etching rate in the etching process, a bottom portion of the SOC layer has a second etching rate in the etching process, and a ratio of the first etching rate to the second etching rate is in a range from about 0.9 to about 1.1.

11. The method of claim 9, wherein the chemically treated upper portion of the SOC layer has a first etching rate in the etching process, the sacrificial layer has a second etching rate in the etching process, and a ratio of the first etching rate to the second etching rate is in a range from about 0.9 to about 1.1.

12. The method of claim 1, wherein the target structure comprises a first dummy gate structure, and etching the target structure is performed such that the first dummy gate structure is separated into a plurality of second dummy gate structures.

13. The method of claim 12, further comprising:
replacing the second dummy gate structures with a plurality of metal gate structures.

14. A method, comprising:
forming a spin-on carbon (SOC) layer over a target structure;
chemically treating an upper portion of the SOC layer;
forming a sacrificial layer over the chemically treated upper portion of the SOC layer;
polishing the sacrificial layer until the chemically treated upper portion of the SOC layer is exposed; and
non-selectively etching the SOC layer and the sacrificial layer.

15. The method of claim 14, wherein non-selectively etching the SOC layer and the sacrificial layer comprises etching a bottom portion of the SOC layer.

16. The method of claim 14, wherein a top surface of the SOC layer after non-selectively etching the SOC layer and the sacrificial layer is flatter than the top surface of the SOC layer before forming the sacrificial layer.

17. The method of claim 14, wherein chemically treating the upper portion of the SOC layer is performed such that the chemically treated upper portion of the SOC layer has a higher degree of crosslinks than a bottom portion of the SOC layer.

18. A method, comprising:
forming a spin-on carbon (SOC) layer over a target structure;
chemically treating an upper portion of the SOC layer, such that the upper portion of the SOC layer has a higher degree of crosslinks than a bottom portion of the SOC layer;
forming a sacrificial layer over the SOC layer;
polishing the sacrificial layer until reaching the SOC layer;
forming a patterned photoresist layer over the SOC layer after polishing the sacrificial layer; and
etching the target structure using the patterned photoresist layer as a mask.

19. The method of claim 18, wherein the degree of crosslinks in the chemically treated upper portion of the SOC layer increases from a bottom of the chemically treated upper portion of the SOC layer to a top surface of the chemically treated upper portion of the SOC layer.

20. The method of claim 18, wherein the sacrificial layer comprises a SOC material that has a lower degree of crosslinks than the SOC layer.

* * * * *